(12) United States Patent
Matsumoto

(10) Patent No.: US 7,220,529 B2
(45) Date of Patent: May 22, 2007

(54) PHOTOPOLYMERIZABLE COMPOSITION AND RECORDING MATERIAL USING THE SAME

(75) Inventor: Hirotaka Matsumoto, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 99 days.

(21) Appl. No.: 11/060,300

(22) Filed: Feb. 18, 2005

(65) Prior Publication Data

US 2005/0186504 A1    Aug. 25, 2005

(30) Foreign Application Priority Data

Feb. 19, 2004    (JP)    ............... 2004-042913

(51) Int. Cl.
*G03F 7/021*    (2006.01)
*G03F 7/031*    (2006.01)

(52) U.S. Cl. .................. 430/138; 430/157; 430/179; 430/281.1; 430/283.1; 430/288.1

(58) Field of Classification Search ............ 430/281.1, 430/288.1, 283.1, 138, 157, 179
See application file for complete search history.

(56) References Cited

U.S. PATENT DOCUMENTS 6,562,542 B2 *  5/2003  Ohkawa et al. .......... 430/270.1

\* cited by examiner

*Primary Examiner*—John S. Chu
(74) *Attorney, Agent, or Firm*—Sughrue Mion, PLLC

(57) ABSTRACT

A photopolymerizable composition comprising at least a polymerizable compound having an ethylenically unsaturated bond, a photo-radical generator, and an amine compound represented by the following Formula (I):

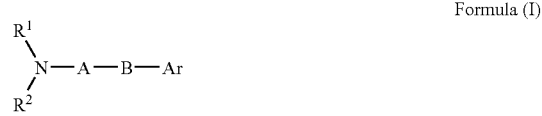

Formula (I)

wherein $R^1$ and $R^2$ independently represent an optionally substituted aliphatic group, or may be bound to each other to form a ring, A represents an optionally substituted divalent aliphatic linking group, or may be bound to $R^1$ or $R^2$ to form a ring, B represents an optionally substituted divalent linking group selected from an amide linkage, a sulfonamide linkage and an ester linkage, or may be bound to $R^1$ or $R^2$ to form a ring, and Ar represents an optionally substituted aromatic group.

20 Claims, No Drawings

PHOTOPOLYMERIZABLE COMPOSITION AND RECORDING MATERIAL USING THE SAME

CROSS-REFERENCE TO RELATED APPLICATION

This application claims priority under 35 USC 119 from Japanese Patent Application No. 2004-042913, the disclosure of which is incorporated by reference herein.

BACKGROUND OF THE INVENTION

1. Field of the Invention

The present invention relates to a photopolymerizable composition and a recording material using the same. In particular, it relates to a photopolymerizable composition and a recording material which can be used favorably in various fields, having improvements in sensitivity, storability of unprocessed stock, surface yellowing (stain) resistance, and light fixation.

2. Description of the Related Art

A photopolymerizable composition basically contains a photopolymerization initiator and an addition-polymerizable compound containing two or more ethylenically unsaturated bonds in its molecule (also referred to hereinafter as "multifunctional monomer"), and is cured by irradiation with light thereby changing its adhesiveness or making it insoluble with solvent. Owing to these properties, the photopolymerizable composition is used widely in such areas as photography, printing, metallic surface processing, and in ink. Much literature is available describing functions and applications of photopolymerizable compositions (for example, J. Kosar: Light Sensitive Systems, J. Wiley & Sons, New York, 1965, pp. 158–193, and K. I. Jacobson, R. E. Jacobson: Imaging Systems, J. Wiley & Sons, New York, 1976, pp. 181–222)).

Image formation systems utilizing photosensitive microcapsules, in which a photopolymerizable composition is encapsulated in microcapsules, have been proposed recently as methods of image formation that use a photopolymerizable composition. For example, Japanese Patent Application Laid-Open (JP-A) Nos. 57-124343, 57-179836 and 57-197538 disclose a method of forming dye images involving a coloration sheet on which a photopolymerizable composition comprising a vinyl compound and a photopolymerization initiator and microcapsules containing a dye have been coated. The sheet is first exposed to light, then placed on an image-receiving sheet and the entirety thereof is pressed.

JP-A Nos. 03-4087827 and 04-211252 describe photosensitive heat-sensitive coloration recording materials containing two components. One of the two components is encapsulated in microcapsules, and the other is a curable compound in a photosetting composition, or, together with a photosetting composition, is contained outside of the microcapsules. As an example of the latter, a photosensitive heat-sensitive recording material is described which is provided with a layer containing microcapsules that encapsulate an electron-donating colorless dye and a photosetting composition outside of the microcapsules that contains an electro-receiving compound, a polymerizable vinyl monomer, and a photopolymerization initiator.

As described above, recording materials utilizing a photopolymerizable composition enable image recording in a completely dry system without using, for example, a developing solution. Their use is very preferable as waste harmful to the environment is not generated.

Regarding sensitization, use of inexpensive infrared laser and blue to red-range light would be advantageous to image recording on photosensitive recording materials, however, a majority of recording materials that make use of photosensitive compositions are sensitized with UV or short-wavelength visible light and not with visible to infrared-range light, or are poor in sensitivity even if they can be sensitized. As a result, formed images are not vivid, or may have poor contrast between image and non-image regions, and thus higher sensitivity is desirable.

A composition containing a thiol-containing compound as a polymerization assistant has thus been proposed by the inventors as a photopolymerizable composition usable in various recording materials, in response to the need for higher sensitivity and photosensitivity to light sources of wavelengths longer than those of visible rays (see, for example, JP-A No. 64-013144). A problem is, however, encountered with application of this photopolymerizable composition to recording materials. When, for examle, a vinyl sulfone-based hardener is used in a gelatin binder system, the polymerization assistant reacts with the hardener with results including deteriorated storage stability or photosensitivity that changes depending on humidity.

It has also been proposed that, an amine compound such as N,N-dialkyl aniline in Japanese Patent No. 2679830 or a benzylamine compound or the like in JP-A No. 2002-308922 be added as an oxygen quencher and thereby attain higher sensitivity, improve unprocessed stock storability and reduce surface stain. The effects, however, are still not sufficient and there is room for further improvements.

The present invention has been devised to solve the aforementioned problems in the related art, and to achieve the following objects.

An object of the invention is to provide a photopolymerizable composition which responds with high sensitivity not only to ultraviolet light but also to light in the visible to infrared renge and which is excellent in unprocessed stock storability.

Another object of the invention is to provide a recording material that is capable of highly sensitive recording using not only ultraviolet rays but also visible to infrared-range rays and that is excellent in various aspects including unprocessed stock storability, surface yellowing (stain) resistance, light fixation, and humidity dependence, all in a completely dry system not requiring use of, for example, a developing solution and without generation of any waste.

SUMMARY OF THE INVENTION

A first aspect of the present invention is to provide a photopolymerizable composition comprising at least a polymerizable compound having an ethylenically unsaturated bond, a photo-radical generator, and an amine compound represented by the following Formula (I):

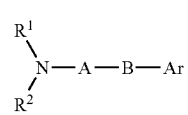

Formula (I)

wherein $R^1$ and $R^2$ independently represent an optionally substituted aliphatic group, or may be bound to each other to form a ring, A represents an optionally substituted divalent aliphatic linking group, or may be bound to $R^1$ or $R^2$ to form a ring, B represents an optionally substituted divalent linking group selected from an amide linkage, a sulfonamide linkage and an ester linkage, or may be bound to $R^1$ or $R^2$ to form a ring, and Ar represents an optionally substituted aromatic group.

A second aspect of the invention is to provide a recording material having a recording layer arranged on a support, wherein the recording layer comprises a photopolymerizable composition containing at least a polymerizable compound having an ethylenically unsaturated bond, a photo-radical generator, and an amine compound represented by the following Formula (I):

Formula (I)

wherein $R^1$ and $R^2$ independently represent an optionally substituted aliphatic group, or may

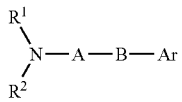

be bound to each other to form a ring, A represents an optionally substituted divalent aliphatic linking group, or may be bound to $R^1$ or $R^2$ to form a ring, B represents an optionally substituted divalent linking group selected from an amide linkage, a sulfonamide linkage and an ester linkage, or may be bound to $R^1$ or $R^2$ to form a ring, and Ar represents an optionally substituted aromatic group.

A third aspect of the invention is to provide a recording material having a recording layer arranged on a support, wherein the recording layer has a multilayer structure comprising of a first recording layer sensitized with light of central wavelength $\lambda_1$, a second recording layer sensitized with light of central wavelength $\lambda_2$ to produce a different color than that of the first recording layer, . . . , and an i-th recording layer sensitized with light of central wavelength $\lambda_i$ to produce a different color than those of the first, second, . . . , and i–1 th recording layers laminated in this order, each recording layer comprising a photopolymerizable composition containing a polymerizable compound having an ethylenically unsaturated bond, a photo-radial generator, and an amine compound represented by the following Formula (I):

Formula (I)

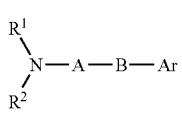

wherein $R^1$ and $R^2$ independently represent an optionally substituted aliphatic group, or may be bound to each other to form a ring, A represents an optionally substituted divalent aliphatic linking group, or may be bound to $R^1$ or $R^2$ to form a ring, B represents an optionally substituted divalent linking group selected from an amide linkage, a sulfonamide linkage and an ester linkage, or may be bound to $R^1$ or $R^2$ to form a ring, and Ar represents an optionally substituted aromatic group.

DETAILED DESCRIPTION OF THE INVENTION

The photopolymerizable composition of the present invention comprises at least a polymerizable compound having an ethylenically unsaturated bond, a photo-radical initiator, and an amine compound represented by Formula (I) and if necessary other compounds. In the recording material of the invention, the recording layer on a support contains the photopolymerizable composition of the invention together with a coloration component etc.

Hereinafter, the photopolymerizable composition of the invention is described, and through the description, the recording material of the invention is also described in detail.

(Polymerizable Compound having an Ethylenically Unsaturated Bond)

The photopolymerizable composition of the invention contains a polymerizable compound having an ethylenically unsaturated bond (hereinafter referred to sometimes as "polymerizable compound").

The polymerizable compound is a polymerizable compound having at least one ethylenically unsaturated double bond in its molecule, and the polymerizable compound is not particularly limited, and can be selected suitably depending on purposes. Examples thereof include acrylic acid derivatives such as acrylates and acrylamides, acrylic acid and salts thereof, methacrylic acid derivatives such as methacrylates, methacrylamides, methacrylic acid and its salts, maleic anhydride, maleates, itaconic acid, itaconates, styrene and derivatives thereof, vinyl ethers, vinyl esters, N-vinyl heterocycles, allyl ethers, allyl esters, etc.

The above-mentioned polymerizable compound may include one or more olefinic double bonds and have a low molecular weight (monomer property) or a high molecular weight (oligomer property).

The monomer having a double bond includes, for example, alkyl or hydroxyalkyl acrylate or methacrylate such as methyl acrylate, ethyl acrylate, butyl acrylate, 2-ethylhexyl acrylate, 2-hydroxyethyl acrylate, isobornyl acrylate, methyl methacrylate or ethyl methacrylate. Silicon acrylate is also advantageous.

Other examples include acrylonitrile, acrylamide, methacrylamide, N-substituted (meth)acrylamide, vinyl ester such as vinyl acetate, vinyl ether such as isobutyl vinyl ether, styrene, alkyl- and halo-styrene, N-vinyl pyrrolidone, vinyl chloride and vinylidene chloride.

Examples of the monomer containing two or more double bonds include diacrylate of ethylene glycol, propylene glycol, neopentyl glycol, hexamethylene glycol, bisphenol A etc., 4,4'-bis(2-acryloyloxyethoxy)diphenyl propane, trimethylol propane triacrylate, pentaerythritol triacrylate or tetraacrylate, vinyl acrylate, divinyl benzene, divinyl succinate, diallyl phthalate, triallyl phosphate, triallyl isocyanurate or tris(2-acryloylethyl) isocyanurate etc.

Examples of the multi-unsaturated compound of a relatively high molecular weight (oligomer property) include (meth)acryl-containing epoxy resins, (meth)acryl-containing polyesters, vinyl ether- or epoxy group-containing polyesters, polyurethanes, and polyethers. Further, examples of the unsaturated oligomer include unsaturated polyester resin generally produced from maleic acid, phthalic acid, and one or more diols and having a molecular weight of about 500 to 3,000. Additionally, vinyl ether monomers and oligomers, and oligomers having polyesters, polyurethanes, polyethers, polyvinyl ethers, and epoxy groups as main chains and terminated with maleate may be employed. Especially suitable examples are combinations of oligomers having vinyl ethers and polymers described in WO90/01512. Further, copolymers of vinyl ether and monomers provided with a maleic acid functional group are also suitable. Such kinds of unsaturated oligomers can be employed as prepolymers.

Especially preferable examples are esters of ethylenic unsaturated carboxylic acids with polyols or polyepoxides, polymers having ethylenic unsaturated groups in the main chain or a side chain such as unsaturated polyesters, polyamides, and polyurethanes and their copolymers, alkid resins, polybutadiene, butadiene copolymers, polyisoprene, isoprene copolymers, polymers and copolymers containing (meth)acryl in the side chain and mixtures of one or more of such polymers.

Examples of the unsaturated carboxylic acids include unsaturated fatty acids such as acrylic acid, methacrylic acid, crotonic acid, itaconic acid, cinnamic acid, linoleic acid and oleic acid. Among these, acrylic acid and methacrylic acid are preferable.

Suitable polyols are aromatic and particularly aliphatic and alicyclic polyols.

Examples of the aromatic polyols include hydroquinone, 4,4'-dihydroxydiphenyl, 2,2-di(4-hydroxyphenyl)propane, novolak, and resorcin. Examples of the polyepoxide are those containing the above-mentioned polyols, particularly aromatic polyols and epichlorohydrine as a base. Suitable polyols other than these examples are polymers and copolymers containing hydroxyl in the polymer chain or the side chain and examples thereof include polyvinyl alcohol and its copolymers, and polyhydroxylalkyl methacrylate and copolymers thereof. Further preferable polyols are oligoesters having hydroxy terminal groups.

Examples of the aliphatic and alicyclic polyols include alkylene diols preferably having 2 to 12 carbon atoms such as ethylene glycol, 1,2- or 1,3-propenediol, 1,2-, 1,3- or 1,4-butanediol, pentanediol, hexanediol, octanediol, dodecanediol, diethylene glycol, and triethylene glycol; preferably polyethylene glycol having 200 to 1,500 molecular weight, 1,3-cyclopentanediol, 1,2-, 1,3-, or 1,4-cyclohexanediol, 1,4-dihydroxymethylcyclohexane, glycerol, tris(β-hydroxyethyl)amine, trimethylolethane, trimethylolpropane, pentaerythritol, dipentaerythritol and sorbitol.

Polyols can be partially or completely esterified with one kind of carboxylic acid or different unsaturated carboxylic acids and in the partially esterified compounds, free hydroxyl may be modified and, for example, etherified or esterified with other carboxylic acids.

Examples of the esters are as follows. That is, trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol diacrylate, 1,3-butanediol diacrylate, 1,3-butanediol dimethacrylate, 1,4-butanediol diitaconate, sorbitol triacrylate, sorbitol tetraacrylate, pentaerythritol-modified triacrylate, sorbitol tetramethacrylate, sorbitol pentaacrylate, sorbitol hexaacrylate, oligoester acrylate, and methacrylate, glycerol diacrylate, and triacrylate, 1,4-cyclohexane diacrylate, bisacrylate and bismethacrylate of polyethylene glycol with a molecular weight of 200 to 1,500 and their mixtures.

Further, those suitable for the above-mentioned polymerizable compound are amides of a single or different unsaturated carboxylic acid and aromatic, alicyclic and aliphatic polyamine having preferably 2 to 6, and more preferably 2 to 4 amino groups.

Examples of such polyamine include ethylene diamine, 1,2- or 1,3-propylene diamine, 1,2-, 1,3- or 1,4-butylene diamine, 1,5-pentylene diamine, 1,6-hexylene diamine, octylene diamine, dodecylene diamine, 1,4-diaminocyclohexane, isophorone diamine, phenylene diamine, bisphenylene diamine, di-β-aminoethyl ether, diethylene triamine, triethylene tetramine, di(β-aminoethoxy)- or di(β-aminopropoxy)ethane. Other preferable examples include a polymer or copolymer further having an amino group in its side chain and an oligoamide having a terminal amino group. Examples of such unsaturated amides include methylene bisacrylamide, 1,6-hexamethylene bisacrylamide, diethylene triamine trismethacrylamide, bis(methacrylamide propoxy)ethane, β-methacrylamide ethyl methacrylate, and N-[(β-hydroxyethoxy)ethyl]acrylamide.

Suitable unsaturated polyesters and polyamides, for example, can be derived from maleic acid in combination with diols or diamines. A portion of maleic acid can be replaced with another dicarboxylic acid. They may be used in combination with an ethylenic unsaturated co-monomer, such as styrene. The polyesters and polyamides can be derived from dicarboxylic acids in combination with ethylenic unsaturated diols and diamines and particularly from those with a relatively long chain, for example, having 6 to 20 carbon atoms. Examples of polyurethanes include those derived from saturated or unsaturated diisocyanates and unsaturated or respectively saturated diols.

Polybutadiene and polyisoprene and copolymers thereof are known. Examples of suitable comonomers include olefins such as ethylene, propene, butene and hexene, (meth)acrylate, acrylonitrile, styrene and vinyl chloride. A polymer having a (meth)acrylate group in its side chain is similarly known. For example, it can be obtained as a reaction product of epoxy resin based on novolak and (meth)acrylic acid, or can be a homo- or copolymer of vinyl alcohol or (meth)acrylic acid and an esterified hydroxy alkyl derivative thereof, or a homo- or copolymer of (meth)acrylate esterified with hydroxy alkyl (meth)acrylate.

The polymerizable compound may be a compound having a site for exhibiting another function in its structure, depending on applications of the photopolymerizable composition; for example, when the photopolymerizable composition is utilized in a recording material, the polymerizable compound may have a site for promoting the coloration reaction of a coloration component constituting an image part, or a site for regulating coloration. These will be described later.

The content of the polymerizable compound containing the above-mentioned ethylenic unsaturated bond is generally 10 to 99% by weight, preferably 30 to 95% by weight, of the entire weight of the photopolymerizable composition.

The photo-radical generator includes benzophenone, camphor quinone, 4,4-bis(dimethylamino)benzophenone, 4-methoxy-4'-dimethylaminobenzophenone, 4,4'-dimethoxybenzophenone, 4-dimethylaminobenzophenone, 4-dimethylaminoacetophenone, benzyl anthraquinone, 2-tertbutyl anthraquinone, 2-methyl anthraquinone, xanthone, thioxanthone, 2-chlorothioxanthone, 2,4-diethyl thioxanthone, fluorenone, acridone, bisacyl phosphine oxide such as bis(2,4,6-trimethylbenzoyl)-phenyl phosphine oxide, acyl phosphine oxide such as Lucirin TPO, α-hydroxy or α-aminoacetophenone, α-hydroxycycloalkyl phenyl ketone, and aromatic ketones such as dialkoxy acetophenone;

benzoin and benzoin ethers such as benzoin methyl ether, benzoin ethyl ether, benzoin isopropyl ether and benzoin phenyl ether; 2,4,6-triaryl imidazole dimers such as 2-(o-chlorophenyl)-4,5-diphenylimidazole dimer, 2-o-chlorophenyl)-4,5-di(m-methoxyphenyl)imidazole dimer, 2-(o-fluorophenyl)-4,5-diphenyl imidazole dimer, 2-(o-methoxyphenyl)-4,5-diphenyl imidazole dimer and 2-(p-methoxyphenyl)-4,5-diphenyl imidazole dimer, lophine dimer compounds described in U.S. Pat. Nos. 3,784,557, 4,252,887, 4,311,783, 4,459,349, 4,410,621 and 4,622,286;

polyhalogen compounds such as carbon tetrabromide, phenyl tribromomethyl sulfone and phenyl trichloromethyl ketone; compounds described in JP-A Nos. 59-133428, Japanese Patent Application Publication (JP-B) Nos. 57-1819, 57-6096 and U.S. Pat. No. 3,615,455; S-triazine derivatives having a trihalogen-substituted methyl group (trihalomethyl compounds) described in JP-A No. 58-29803, such as 2,4,6-tris(trichloromethyl)-S-triazine, 2-methoxy-4,6-bis(trichloromethyl)-S-triazine, 2-amino-4,6-bis(trichloromethyl)-S-triazine and 2-(P-methoxystyryl)-4,6-bis(trichloromethyl)-S-triazine;

organic peroxides described in JP-A No. 59-189340, such as methyl ethyl ketone peroxide, cyclohexanone peroxide, 3,3,5-trimethyl cyclohexanone peroxide, benzoyl peroxide, di-tert-butyl peroxy isophthalate, 2,5-dimethyl-2,5-di(benzoyl peroxy)hexane, tert-butyl peroxy benzoate, α,α'-bis(tert-butyl peroxy isopropyl)benzene, dicumyl peroxide and 3,3',4,4'-tetra-(tert-butyl peroxycarbonyl)benzophenone;

azinium compounds; organic boron compounds; phenylglyoxalic acid esters such as phenylglyoxalic methyl ester; titanocenes such as bis(η5-2,4-cyclopentadien-1-yl)-bis(2,6-difluoro-3-(1H-pyrrol-1-yl)-phenyl)titanium and the like; iron allene complexes such as η5-cyclopentadienyl-η6-cumenyl-iron (1+)-hexafluorophosphate (1−) and the like; diaryl iodonium salts such as diphenyl iodonium and the like; and triaryl sulfonium salts such as triphenyl sulfonium salt and the like as described in U.S. Pat. No. 4,743,530;

More detailed examples of the above-mentioned radical generating agent and examples of other kinds of radical generating agents are described in paragraphs [0067] to [0132] of JP-A No. 10-45816.

Moreover, as the above-mentioned radical generating agent, two or more kinds of those exemplified compounds may be used in combination. Examples thereof include the following: combinations of 2,4,5-triarylimidazole dimer and mercaptobenzoxazole, combinations of 4,4'-bis(dimethylamino)benzophenone, benzophenone, and benzoin methyl ether described in U.S. Pat. No. 3,427,161, combination of benzoyl-N-methylnaphtothiazoline and 2,4-bis(trichloromethyl)-6-(4'-methoxyphenyl)-triazole described in U.S. Pat. No. 4,239,850, combinations of dialkylaminobenzoic acid ester and dimethyltihoxanthone described in JP-A No. 57-23602, and combination of three kinds of compounds (4,4'-bis(dimethylamino)benzophenone, benzophenone, and polyhalogenated methyl compound) described in JP-A No. 59-78339.

Preferably, the radical generator consisting of a combination of two or more compounds makes use of a combination of 4,4'-bis(diethylamino)benzophenone and benzophenone, a combination of 2,4-diethylthioxanthone and ethyl 4-dimethylaminobenzoate, or a combination of 4,4'-bis(diethylamino)benzophenone and a lophine dimer compound such as 2,4,5-triaryl imidazole dimer.

Among the radical generators described above, the organic boron compound, diaryl iodonium salt, iron/allene complex, S-triazine derivative having a trihalogen-substituted methyl group, organic peroxide, titanocene, lophine dimer compound such as 2,4,5-triaryl imidazole dimer, and azinium salt compound are preferable in that they can interact with a dye in a light-exposed region thereby generating radicals effectively and attaining higher sensitivity, and the lophine dimer compound is particularly preferable. The lophine dimer compound is preferable when a spectral sensitizing dye is used as the spectral sensitizing compound, or when the coexisting spectral sensitizing dye can be decolorized well in fixing an image by irradiation with light. The lophine dimer compound may be used in combination with the radical generator.

The organic boron compounds include the compounds represented by the general formula (A) which will be described later and spectral sensitizing dye-type organic boron compounds having, as cationic portions, cationic dyes described in "Chemistry of Functional Dye", CMC Publishing Co., Ltd., 1981, pp. 393–416, "Color formation Materials", 60 [4], 1987, 212–224. Examples of the spectral sensitizing dye-type organic boron compounds include compounds described in JP-A Nos. 62-143044, 1-138204, Japanese Patent Application National Publication No. 6-505287 and JP-A No. 4-261406.

As the dyes composing the cationic portions of the above-mentioned spectral sensitizing dye-type organic boron compounds, cationic dyes having a maximum absorption wavelength in a wavelength region of at least 300 nm, preferably in a wavelength region of 400 to 1,100 nm, may be used. Among them, cationic methine dyes, polyemthine dyes, triarylmethane dyes, indoline dyes, azine dyes, xanthene dyes, cyanine dyes, hemicyanine dyes, Rhodamine dyes, azomethine dyes, oxazine dyes, and acridine dyes are preferable and cationic cyanine dyes, hemicyanine dyes, Rhodamine dyes, and azomethine dyes are more preferable.

Among the above-mentioned organic boron compounds, the compounds represented by the following general formula (A) are preferable.

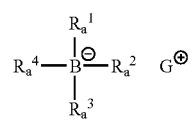

General formula (A)

In Formula (A), $R_a^1$, $R_a^2$, $R_a^3$ and $R_a^4$ independently represent an aliphatic group, an aromatic group, a heterocyclic group or $Si(R_a^5)(R_a^6)$—$R_a^7$.

When $R_a^1$ to $R_a^4$ each represent an aliphatic group, the aliphatic group includes, for example, an alkyl group, substituted alkyl group, alkenyl group, substituted alkenyl group, alkynyl group, substituted alkynyl group, aralkyl group and substituted aralkyl group, preferably an alkyl group, substituted alkyl group, alkenyl group, substituted alkenyl group, aralkyl group and substituted aralkyl group, more preferably an alkyl group and substituted alkyl group.

The aliphatic group may be a cyclic aliphatic group or a linear aliphatic group. The cyclic aliphatic group may be branched.

The alkyl group includes a linear, branched or cyclic alkyl group, and the number of carbon atoms in the alkyl group is preferably 1 to 30, more preferably 1 to 20. The alkyl group is a substituted alkyl group having a substituent group or an unsubstituted alkyl group, and the number of carbon atoms in the alkyl moiety of the substituted alkyl group is also preferably in the same range as defined above in the alkyl group.

The alkyl group includes a methyl group, ethyl group, propyl group, butyl group, pentyl group, hexyl group, cyclopentyl group, neopentyl group, isopropyl group, isobutyl group, cyclohexyl group, octyl group, 2-ethylhexyl group, decyl group, dodecyl group, octadecyl group etc.

The substituent group on the substituted alkyl group includes a carboxyl group, a sulfo group, a cyno group, a halogen atom (for example, a fluorine atom, chlorine atom and bromine atom), a hydroxyl group, an alkoxycarbonyl group containing 30 or less carbon atoms (for example, a methoxycarbonyl group, ethoxycarbonyl group, benzyloxycarbonyl group), an alkylsulfonylaminocarbonyl group containing 30 or less carbon atoms, an arylsulfonylaminocarbonyl group, an alkylsulfonyl group, an arylsulfonyl group, an acylaminosulfonyl group containing 30 or less carbon atoms, an alkoxy group containing 30 or less carbon atoms (for example, a methoxy group, ethoxy group, benzyloxy group, phenethyloxy group etc.), an alkylthio group containing 30 or less carbon atoms (for example, a methylthio group, ethylthio group, methylthioethylthioethyl group etc.), an aryloxy group containing 30 or less carbon atoms (for example, a phenoxy group, p-tolyloxy group, 1-naphthoxy group, 2-naphthoxy group etc.), a nitro group, an alkyl group containing 30 or less carbon atoms, an alkoxycarbonyloxy group, an aryloxycarbonyloxy group;

an acyloxy group containing 30 or less carbon atoms (for example, an acetyloxy group, propionyloxy group etc.), an acyl group containing 30 or less carbon atoms (for example, an acetyl group, propionyl group, benzoyl group etc.), a carbamoyl group (for example, a carbamoyl group, N,N-dimethylcarbamoyl group, morpholinocarbonyl group, piperidinocarbonyl group etc.), a sulfamoyl group (for example, a sulfamoyl group, N,N-dimethylsulfamoyl group, morpholinosulfonyl group, piperidinosulfonyl group etc.), an aryl group containing 30 or less carbon atoms (for example, a phenyl group, 4-chlorophenyl group, 4-methylphenyl group, α-naphthyl group etc.), a substituted amino group (for example, an amino group, alkylamino group, dialkylamino group, arylamino group, diarylamino group, acylamino group etc.), a substituted ureido group, a substituted phosphono group, a heterocyclic group etc. The carboxyl group, sulfo group, hydroxy group or phosphono group may be in the form of a salt. The cation forming the salt includes $G^+$ etc. described later.

The alkenyl group includes a linear, branched or cyclic alkenyl group, and the number of carbon atoms in the alkenyl group is preferably 2 to 30, more preferably 2 to 20. The alkenyl group may be a substituted alkenyl group having a substituent group or an unsubstituted alkenyl group, and the number of carbon atoms in the alkenyl moiety of the substituted alkenyl group is also preferably in the same range as defined in the alkenyl group.

The substituent group on the substituted alkenyl group includes the same substituent group as defined above in the substituted alkyl group.

The alkynyl group includes a linear, branched or cyclic alkynyl group, and the number of carbon groups in the alkynyl group is preferably 2 to 30, more preferably 2 to 20. The alkynyl group may be a substituted alkynyl group having a substituent group or an unsubstituted alkynyl group, and the number of carbon atoms in the alkynyl moiety of the substituted alkynyl group is also preferably in the same range as defined in the alkynyl group.

The substituent group on the substituted alkynyl group includes the same substituent group as defined above in the substituted alkyl group.

The aralkyl group includes a linear, branched or cyclic aralkyl group, and the number of carbon atoms in the aralkyl group is preferably 7 to 35, more preferably 7 to 25. The aralkyl group may be a substituted aralkyl group having a substituted group or an unsubstituted aralkyl group, and the number of carbon atoms in the aralkyl moiety of the substituted aralkyl group is also preferably in the same range as defined in the aralkyl group.

The substituent group on the substituted aralkyl group includes the same substituent group as defined above in the substituted alkyl group.

When $R_a^1$ to $R_a^4$ each represent an aryl group, the aryl group includes, for example, an aryl group and a substituted aryl group. The number of carbon atoms in the aryl group is preferably 6 to 30, more preferably 6 to 20. The number of carbon atoms in the aryl moiety of the substituted aryl group is also preferably in the same range as defined in the aryl group. The aryl group includes, for example, a phenyl group, α-naphthyl group, β-naphthyl group etc.

The substituent group on the substituted aryl group includes the same substituent group as defined above in the substituted alkyl group.

When $R_a^1$ to $R_a^4$ each represent a heterocyclic group, the heterocyclic group includes a heterocyclic group having a substituent group and an unsubstituted heterocyclic group. In the heterocyclic group having a substituent group, the substituent group includes the same substituent group as illustrated above in the substituted aryl group represented by $R_a^1$ to $R_a^4$.

The heterocyclic group represented by $R_a^1$ to $R_a^4$ is particularly preferably a heterocyclic group containing a nitrogen atom, a sulfur atom or an oxygen atom, such as a furan ring, pyrrole ring, imidazole ring, oxazole ring, thiazole ring or pyridine ring.

When $R_a^1$ to $R_a^4$ each represent —Si($R_a^5$)($R_a^6$)—$R_a^7$, $R_a^5$, $R_a^6$ and $R_a^7$ independently represent an aliphatic group or an aromatic group. The aliphatic group and aromatic group have the same meaning as that of the aliphatic group and aromatic group represented by $R_a^1$ to $R_a^4$ above, and preferable examples are also the same as described above.

In the above-mentioned general formula (A), two or more of $Ra^1$, $Ra^2$, $Ra^3$ and $Ra^4$ may be bonded directly or through a substituent group to form a ring. In the case a ring is formed, the ring is preferably any ring selected from the following rings (C1) to (C3) and the ring (C2) is preferable.

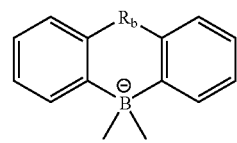

(C1)

-continued

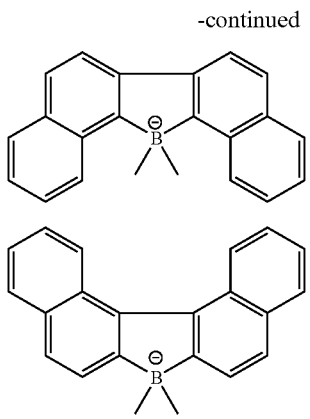

(C2)

(C3)

In the ring in the above-mentioned (C1), $R_b$ represents a divalent group shown below.

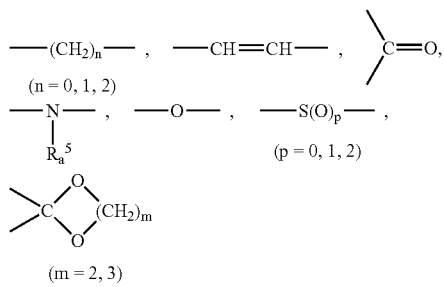

The organic boron compounds represented by Formula (A) above are preferably those wherein at least one of $R_a^1$ to $R_a^4$ is an alkyl group, more preferably triaryl alkyl organic boron compounds wherein one of $R_a^1$ to $R_a^4$ represents an alkyl group and the other three groups each represent an aryl group, from the viewpoint of higher sensitivity and improvement of storability.

Particularly, the organic boron compound is preferably a triaryl alkyl compound whose aryl groups are substituted with electron-withdrawing groups, more preferably a compound wherein the sum of Hammet (σ) values of the substituent groups (electron-withdrawing groups) on the three aryl groups is +0.36 to +2.58.

The electron-withdrawing group is preferably a halogen atom or trifluoromethyl group, more preferably a fluorine atom or chlorine atom.

Examples of the aryl groups substituted with the electron attracting groups include 3-fluorophenyl, 4-fluorophenyl, 2-fluorophenyl, 3-chlorophenyl, 4-chlorophenyl, 3-trifluoromethylphenyl, 4-trifluoromethylphenyl, 3,5-difluorophenyl, 4bromophenyl, 3,4-difluorophenyl, 5-fluoro-2-methylphenyl, 5-fluoro-4-methylphenyl, 5-chloro-2-methylphenyl and 5-chloro-4-methylphenyl.

Examples of the anion portion of the above-mentioned general formula (A) includes tetramethyl borate, tetraethyl borate, tetrabutyl borate, triisobutyl borate, di-n-butyl-di-tert-butyl borate, tri-m-chlorophenyl-n-hexyl borate, triphenylmethyl borate, triphenylethyl borate, triphenylpropyl borate, triphenyl-n-butyl borate, trimesicylbutyl borate, tritolylisopropyl borate, triphenylbenzyl borate, tetra-m-fluorobenzyl borate, triphenylphenetyl borate, triphenyl-p-chlorobenzyl borate, triphenylethenylbutyl borate, di(α-naphthyl)-dipropyl borate, triphenylsilyltriphenyl borate, tritolylsilyltriphenyl borate, tri-n-butyl(dimethylphenylsilyl) borate, diphenyldihexyl borate, tri-m-fluorophenylhexyl borate, tri(5-chloro-4-methylphenyl)hexyl borate, tri-m-fluorophenylcyclohexyl borate and tri-(5-fluoro-2-methylphenyl)hexyl borate.

In Formula (A) above, $G^+$ represents a group capable of forming a cation. In particular, $G^+$ is preferably an organic cationic compound, a transition metal coordination complex cation (compounds described in Japanese Patent No. 2791143), or a metallic cation (for example, $Na^+$, $K^+$, $Li^+$, $Ag^+$, $Fe^{2+}$, $Fe^{3+}$, $Cu^+$, $Cu^{2+}$, $Zn^{2+}$, $Al^{3+}$, $1/2Ca^{2+}$).

The organic cationic compound includes, for example, quaternary ammonium cation, quaternary pyridinium cation, quaternary quinolinium cation, phosphonium cation, iodonium cation, sulfonium cation, and dye cation.

Examples of the above-mentioned quaternary ammonium cations include tetraalkylammonium cations (e.g. tetramethylammonium cation, tetrabutylammonium cation), and tetraarylammonium cations (e.g. tetraphenylammonium cation). Examples of the above-mentioned quaternary pyridinium cations include N-alkylpyridinium cations (e.g. N-methylpyridinium cation), N-arylpyridinium cation (e.g. N-phenylpyridinium cation), N-alkoxypyridinium cation (e.g. 4-phenyl-N-methoxy-pyridinium cation) and N-benzoylpyridinium cation. Examples of the above-mentioned quinolinium cations include N-alkylquinolinium cation (e.g. N-methylquinolinium cation) and N-arylquinolinium cation (e.g. N-phenylquinolinium cation). Examples of the above-mentioned phosphonium cations include tetraarylphosphonium cation (e.g. tetraphenylphosphonium cation). Examples of the above-mentioned iodonium cations include diaryliodonium cation (e.g. diphenyliodonium cation). Examples of the sulfonium cations include triarylsulfonium cation (e.g. triphenylsulfonium cation).

Specific examples of the above-mentioned $G^+$ also include compounds described in columns [0020] to [0038] in JP-A No. 9-188686.

In the above exemplified respective cationic compounds (the exemplified compounds), the alkyl preferably contains 1 to 30 carbons and examples thereof include unsubstituted alkyl such as methyl, ethyl, propyl, isopropyl, butyl, hexyl and the like and the above-mentioned substituted alkyl represented by Ra1 to Ra4 are preferable. Among them, an alkyl containing carbons in number of 1 to 12 are especially preferable.

Preferable examples of the aryl group on each of the cationic compounds illustrated above include a phenyl group, a phenyl group substituted with a halogen atom (for example, a chlorine atom), a phenyl group substituted with an alkyl (for example, a methyl group) and a phenyl group substituted with an alkoxy (for example, a methoxy group).

Specific examples of the organic boron compounds represented by the above-mentioned general formula (A) include compounds described in U.S. Pat. Nos. 3,567,453, 4,343,891, JP-A Nos. 62-143044, 62-150242, 9-188684, 9-188685, 9-188686, 9-188710, JP-B No. 8-9643, JP-A No. 11-269210 and the compounds given below. The organic boron compounds may be used in combination with a radical generating agent which will be described later. However, the above-mentioned organic boron compounds to be employed in the invention are not limited to those exemplified.

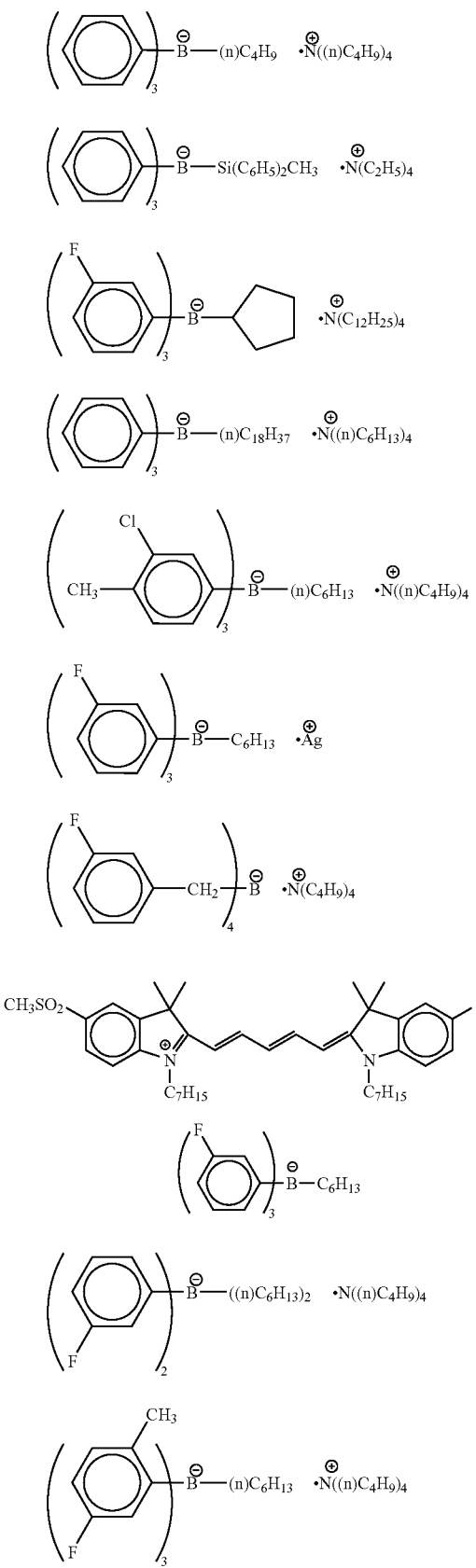
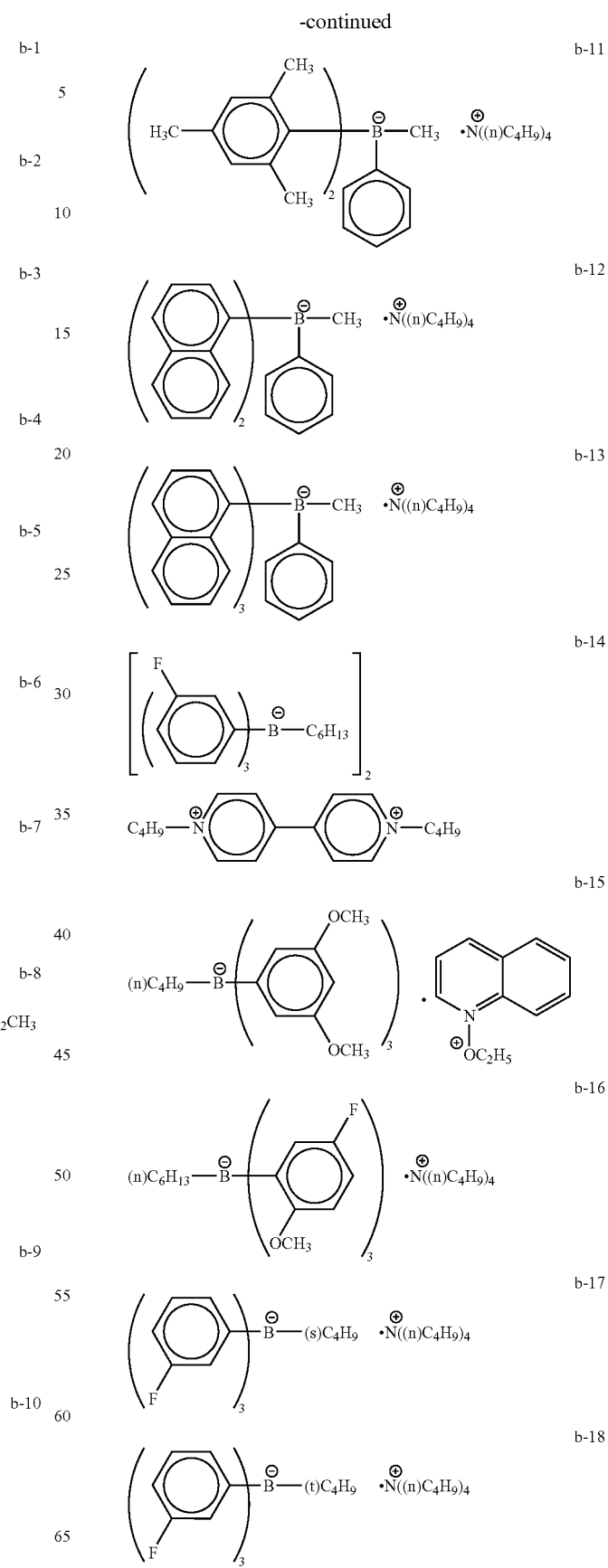

-continued

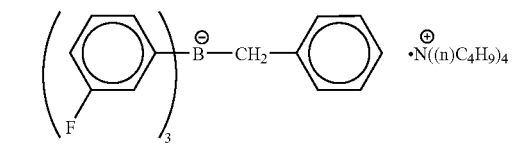
b-19

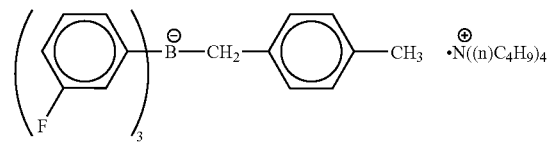
b-20

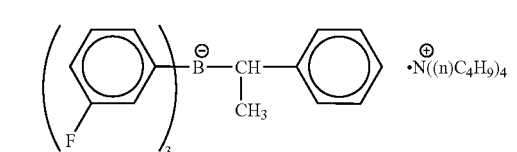
b-21

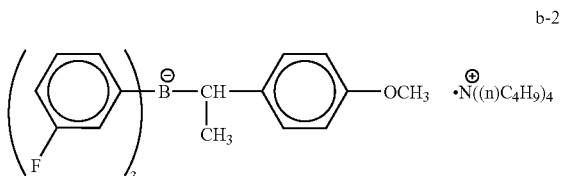
b-22

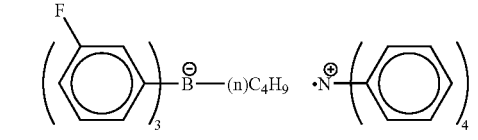
b-23 b-24 b-25 b-26 b-27 b-28 b-29 b-30 b-31 b-32 b-33

The content of the radical generator in the photopolymerizable composition is preferably 0.01 to 20 wt %, more preferably 0.1 to 10 wt %, based on the content of the polymerizable compound having an ethylenically unsaturated bond. However, the preferable range is varied depending on the type of the "polymerizable compound having an ethylenically unsaturated bond" used in combination with the radical generator, and thus this preferable range is not restrictive.

(Amine Compound Represented by Formula (I))

The amine compound contained in the photopolymerizable composition of the invention is represented by Formula (I) below. The amine compound acts as an oxygen quencher or a polymerization assistant, and is allowed to be coexistent with the polymerizable compound and the photo-radical generator thereby improving photopolymerization sensitivity and unprocessed stock storability.

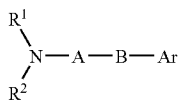

wherein $R^1$ and $R^2$ independently represent an aliphatic group, and the aliphatic group may have a substituent group, or $R^1$ and $R^2$ may be bound to each other to form a ring.

When at least one of R1 to R2 represents an aliphatic group, examples of the aliphatic group include an alkyl, a substituted alkyl, an alkenyl, a substituted alkenyl, an alkinyl, a substituted alkinyl, an aralkyl and a substituted aralkyl. Among these examples, an alkyl, a substituted alkyl, an alkenyl, a substituted alkenyl, an aralkyl, and a substituted aralkyl are preferable and an alkyl and a substituted alkyl are especially preferable.

Moreover, the above-mentioned aliphatic group may be an alicyclic group and a chain aliphatic group. The chain aliphatic group may have branches.

The alkyl group includes a linear, branched or cyclic alkyl group, and the number of carbon atoms in the alkyl group is preferably 1 to 30, more preferably 1 to 20. The number of carbon atoms in the alkyl moiety of the substituted alkyl group is also preferably in the same range as defined in the alkyl group. The alkyl group may be an alkyl group having a substituent group or an unsubstituted alkyl group.

Specific examples of the alkyl group include a methyl group, ethyl group, propyl group, butyl group, pentyl group, hexyl group, octyl group, 2-ethylhexyl group, decyl group, dodecyl group, octadecyl group, cyclohexyl group, cyclopentyl group, neopentyl group, isopropyl group, isobutyl group etc.

The substituent group on the substituted alkyl group includes a carboxyl group, a sulfo group, a cyno group, a halogen atom (for example, a fluorine atom, chlorine atom, bromine atom), a hydroxyl group, an alkoxycarbonyl group containing 30 or less carbon atoms (for example, a methoxycarbonyl group, ethoxycarbonyl group, benzyloxycarbonyl group), an alkylsulfonylaminocarbonyl group containing 30 or less carbon atoms, an arylsulfonylaminocarbonyl group, an alkylsulfonyl group, an arylsulfonyl group, an acylaminosulfonyl group containing 30 or less carbon atoms, an alkoxy group containing 30 or less carbon atoms (for example, a methoxy group, ethoxy group, benzyloxy group, phenoxyethyloxy group, phenethyloxy group etc.), an alkylthio group containing 30 or less carbon atoms (for example, a methylthio group, ethylthio group, methylthioethylthioethyl group etc.), an aryloxy group containing 30 or less carbon atoms (for example, a phenoxy group, p-tolyloxy group, 1-naphthoxy group, 2-naphthoxy group etc.), a nitro group, an alkyl group containing 30 or less carbon atoms, an alkoxycarbonyloxy group, an aryloxycarbonyloxy group;

an acyloxy group containing 30 or less carbon atoms (for example, an acetyloxy group, propionyloxy group etc.), an acyl group containing 30 or less carbon atoms (for example, an acetyl group, propionyl group, benzoyl group etc.), a carbamoyl group (for example, a carbamoyl group, N,N-dimethylcarbamoyl group, morpholinocarbonyl group, piperidinocarbonyl group etc.), a sulfamoyl group (for example, a sulfamoyl group, N,N-dimethylsulfamoyl group, morpholinosulfonyl group, piperidinosulfonyl group etc.), an aryl group containing 30 or less carbon atoms (for example, a phenyl group, 4-chlorophenyl group, 4-methylphenyl group, α-naphthyl group etc.), a substituted amino group (for example, an amino group, alkylamino group, dialkylamino group, arylamino group, diarylamino group, acylamino group etc.), a substituted ureido group, a substituted phosphono group, a heterocyclic group etc. The carboxyl group, sulfo group, hydroxy group or phosphono group may be in the form of a salt. The cation forming the salt includes $G^+$ etc. described later.

The alkenyl group includes a linear, branched or cyclic alkenyl group, and the number of carbon atoms in the alkenyl group is preferably 2 to 30, more preferably 2 to 20. The alkenyl group may be a substituted alkenyl group having a substituted group or an unsubstituted alkenyl group, and the number of carbon atoms in the alkenyl moiety of the substituted alkenyl group is also preferably in the same range as defined in the alkenyl group.

The substituent group on the substituted alkenyl group includes the same substituent group as defined above in the substituted alkyl group.

The alkynyl group includes a linear, branched or cyclic alkynyl group, and the number of carbon groups in the alkynyl group is preferably 2 to 30, more preferably 2 to 20. The alkynyl group may be a substituted alkynyl group having a substituent group or an unsubstituted alkynyl group, and the number of carbon atoms in the alkynyl moiety of the substituted alkynyl group is also preferably in the same range as defined in the alkynyl group.

The substituent group on the substituted alkynyl group includes the same substituent group as defined above in the substituted alkyl group.

The aralkyl group includes a linear, branched or cyclic aralkyl group, and the number of carbon atoms in the aralkyl group is preferably 7 to 35, more preferably 7 to 25. The aralkyl group may be a substituted aralkyl group having a substituted group or an unsubstituted aralkyl group, and the number of carbon atoms in the aralkyl moiety of the substituted aralkyl group is also preferably in the same range as defined in the aralkyl group.

The substituent group on the substituted aralkyl group includes the same substituent group as defined above in the substituted alkyl group.

When $R^1$ and $R^2$ are bound to each other to form a ring, the ring includes an aliphatic or aromatic heterocycle containing at least one nitrogen atom and an aliphatic or aromatic heterocycle containing a heteroatom such as nitrogen atom, oxygen atom, sulfur atom or the like. The ring is preferably a 5- to 7-membered ring, more preferably a 6-membered ring. The ring may have a substituent group or may be condensed with another aliphatic or aromatic ring. When the ring has a substituent group, the substituent group is the same as in the case where the above-mentioned $R^1$ and $R^2$ have a substituent group. Another ring with which the ring is condensed includes a benzene ring, naphthalene ring, cyclohexane ring etc.

Specific examples of the ring formed by $R^1$ and $R^2$ include a piperidine ring, morpholine ring, piperazine ring, pyrrolidine ring, pyrroline ring, imidazolidine ring etc.

In Formula (I), A represents a divalent aliphatic linking group, and the aliphatic linking group may have a substituent group or may be bound to $R^1$ or $R^2$ to form a ring.

The divalent aliphatic linking group represented by A is preferably a C1 to C 12 aliphatic linking group, more preferably a C1 to C10 aliphatic linking group, still more preferably a C1 to C8 aliphatic linking group. When the aliphatic linking group has a substituent group, the substituent group is the same substituent group as in the case where $R^1$ and $R^2$ have a substituent group. When the linking group is bound to $R^1$ or $R^2$ to form a ring, the ring is the same ring as in the case where $R^1$ and $R^2$ are bound to each other to form a ring.

Specific examples of the divalent aliphatic linking group represented by A include a methylene group, ethylene group, propylene group, tetramethylene group, hexamethylene group, 3-hydroxypentamethylene group, etc.

In Formula (I), B represents a divalent linking group selected from an amide linkage (—$NR^3CO$—), a sulfonamide linkage (—$NR^4SO_2$—) and an ester linkage (—O.CO—), and the linking group may have substituent groups ($R^3$, $R^4$) or may be bound to $R^1$ or $R^2$ to form a ring. The substituent groups $R^3$ and $R^4$ independently represent a hydrogen atom or an aliphatic substituent group, and the aliphatic substituent group is the same substituent group as in the case where $R^1$ or $R^2$ has a substituent group. The direction in which the divalent linking group is bound is not limited, and the linking group may be bound via whichever linking bond to the aromatic group A.

Specific examples of the divalent linking group include, for example, —COO—, —O.CO—, —$NHSO_2$—, —$SO_2NH$—, —NHCO—, —CONH—, etc.

In Formula (I), Ar represents an aromatic group, and the aromatic group may have a substituent group.

The aromatic group represented by Ar includes an aryl group which may have a substituent group. The unsubstituted aryl group is preferably a C6 to C20 aryl group, more preferably a C6 to C10 aryl group, and still more preferably a C6 to C8 aryl group. Specific examples of the unsubstituted aryl group include a phenyl group, 1-naphthyl group etc.

The aryl group having a substituent group is preferably a C6 to C20 substituted aryl group, more preferably a C6 to C10 substituted aryl group, still more preferably a C6 to C8 substituted aryl group. The substituent group includes, for example, a p-methoxyphenyl group, p-methylphenyl group, p-chlorophenyl group etc.

Specific examples of the aromatic group represented by Ar include, for example, a phenyl group, p-tolyl group, p-methoxyphenyl group, o-chlorophenyl group, m-(3-sulfopropylamino)phenyl group, 2,6-diethylphenyl group, 2,4,6-trimethylphenyl group, 2,6-dimethyl-4-sulfophenyl group, 2,4-disulfophenyl group etc.

Specific examples of the amine compound represented by Formula (I) in the invention are shown below, but the invention is not limited thereto.

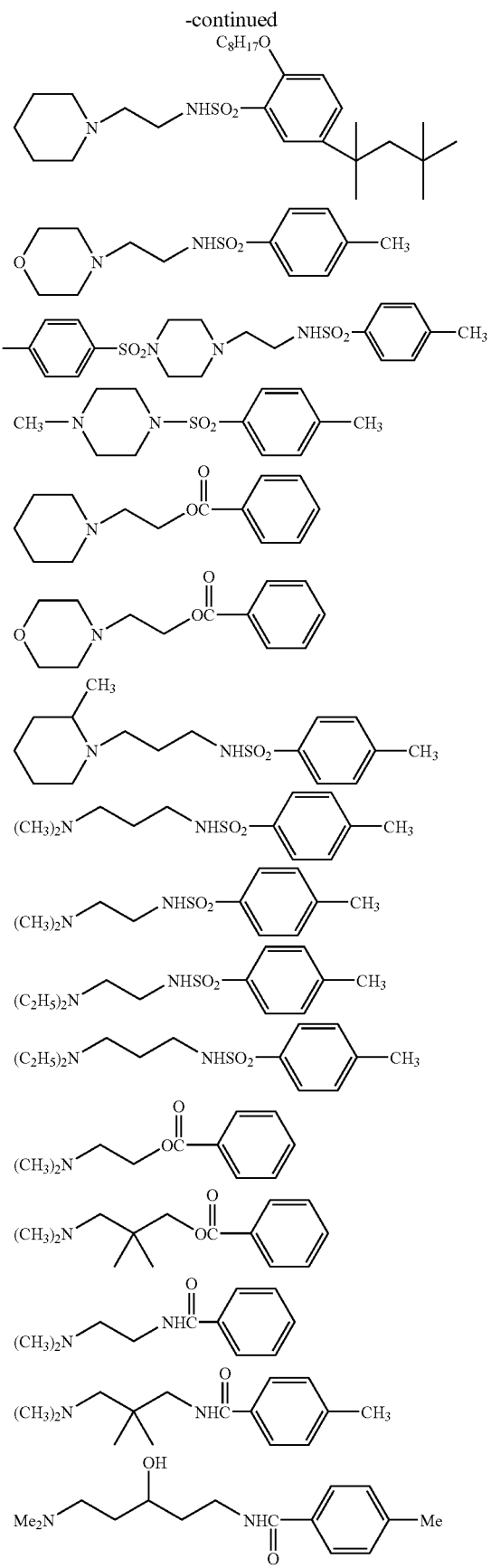

-continued

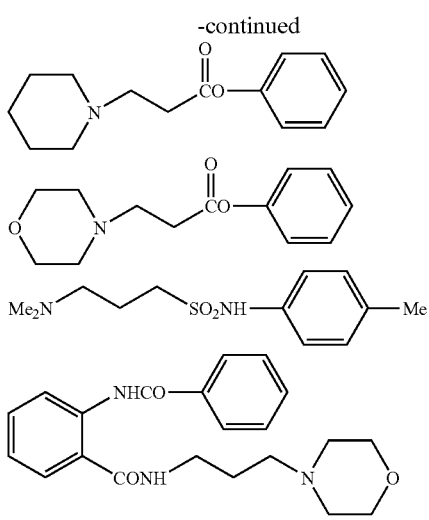

In the invention, the ratio by weight of the amine compound to the polymerizable compound, that is, the (amine compound/polymerizable compound) ratio by weight is preferably in the range of 1/1000 to 1/1, more preferably 1/100 to 1/5, most preferably 1/50 to 1/10. When the ratio is in the range of 1/1000 to 1/1, the polymerization reactivity can be sufficiently improved, and the storability can be improved. That is, the photopolymerization sensitivity is improved, and the unprocessed stock storability is made excellent.

(Other Components)

In the photopolymerizable composition of the invention, well-known additives properly selected depending on the purpose of the invention may be added to the extent that they do not inhibit the effects of the invention.

The other components include, for example, a photopolymerization initiator, an oxygen scavenger, a heat-polymerization inhibitor, an UV absorber, a fluorescent brightener, a chain transfer agent, an antioxidant, or precursors thereof, and these components are added preferably in an amount of 0.01 to 20 mass %, more preferably 0.2 to 15 mass %, still more preferably 0.5 to 10 mass %, based on the total weight of the photopolymerizable composition.

Specific examples of the additives such as the above-mentioned chain transporting agent and antioxidant include compounds described in paragraphs [0135] to [0141] of JP-A No. 10-45816, paragraphs [0087] to [0096] of JP-JP-A No. 9-188686, paragraphs [0079] to [0118] of JP-A No. 10-182621, paragraphs [0080] to [0089] of JP-A No. 9-95487 and further compounds described in JP-A Nos. 1-13140, 1-13141, 1-13143, 1-13144, 1-17048, 1-229003, 1-298348, 10-138638, 11-269210, 2-187762 and the like.

The photopolymerizable composition of the invention may also contain a binder. Especially, the binder addition is suitable in the case the photopolymerizable composition is a liquid or a viscous substance.

The content of the binder is preferably 5 to 95 mass %, more preferably 10 to 90 mass %, still more preferably 15 to 85 mass %, based on the total solids content.

The binder can be selected depending on the field to which it is applied and on characteristics necessary for the field, such as development performance in an aqueous or organic solvent, adhesion to a substrate, and sensitivity to oxygen.

The above-mentioned binder is preferably a compolymer having a molecular weight of about 5,000 to 2,000,000, and preferably 10,000 to 1,000,000. Examples include homo or copolymers of acrylate and methacrylate [e.g. methyl methacrylate, ethyl acrylate/methacrylic acid copolymer, poly (alkyl methacrylate), poly(alkyl acrylate) and the like], cellulose esters or cellulose ethers (e.g. cellulose acetate, cellulose acetobutyrate, methyl cellulose, ethyl cellulose, and the like), polyvinyl butyral, polyvinyl formal, cyclized rubber, polyethers (e.g. polyethylene oxide, polypropylene oxide, polytetrahydrofuran), polystyrene, polycarbonates, polyurethanes, chlorinated polyolefins, polyvinyl chloride, vinyl chloride/vinylidene copolymers, copolymers of vinylidene chloride and acrylonitrile, methyl methacrylate, vinyl acetate, polyvinyl acetate, ethylene-vinyl acetate copolymers, polylcaprolactone, poly(hexamethyleneadipamide), polyesters [e.g. poly(ethylene glycol terephthalate), poly(hexamethylene glycol succinate), and the like], polyamides, and polyureas.

Further, examples of the binder include water-soluble polymers such as gelatins, (modified) polyvinyl alcohol, polyvinyl pyrrolidone, styrene-maleic acid copolymer hydrolysis products, poly(sodium styrenesulfonate), sodium alginate. Further, latexes such as styrene-butadiene rubber latex, acrylonitrile-butadiene rubber latex, methyl acrylate-butadiene rubber latex and the like may be employed.

An unsaturated compound can also be used as a mixture with non-photopolymerizable film-forming components, and examples include nitrocellulose and cellulose acetobutyrate in the form of a physically dried polymer or a polymer solution in an organic solvent. However, such compounds may be chemically and/or thermally curable (thermosetting) resin, for example polyisocyanate, polyepoxide, melamine resin or a polyimide precursor. Simultaneous use of the thermosetting resin is important for use in a system known as a hybrid system consisting of photopolymerization in a first stage and crosslinkage by post-treatment with heating in a second stage.

A binder having a polymerizable group can also be used.

Besides, examples of the additives include those described in JP-A No. 11-269210.

A light source usable at the time of carrying out image-wise exposure may be appropriately selected from among well-known light sources having light source wavelength in a region recovering the visible light rays to IR ray wavelength and above all, a light source having the maximum absorption wavelength of 300 to 1,000 nm is preferable and in terms of easy miniaturization of the apparatus and keeping cost down, a blue-, green-, or red-emitting (semiconductor)laser light source or LED is more preferable. Incidentally, in order to obtain higher sensitivity, it is preferable to properly select a light source with wavelength similar to the absorption wavelength of the light absorber such as a spectral sensitizing dye and the like.

On one hand, as the light source usable for decolorization of the photopolymerizable composition and the recording material described later, a light source of wavelengths suitable for the absorption wavelength of the photopolymerizable composition is preferably selected as necessary. Preferable examples include a wide variety of light sources such as a mercury lamp, an ultrahigh-pressure mercury lamp, an electrode-free discharge mercury lamp, a xenon lamp, a tungsten lamp, a metal hydride lamp, a (semiconductor) laser light source, LED and a fluorescent lamp.

By incorporation of the amine compound represented by Formula (I) as a polymerization assistant, the photopolymerizable composition of the invention unlike the conventional one does not react with a vinyl sulfone-based hardener upon application to a recording material, thus improving storability. Even if the photopolymerizable composition of the invention is used in combination with a highly water-soluble compound, the adverse influence of humidity can be prevented by the amine compound represented by Formula (I).

(Recording Material)

The recording material of the invention has a recording layer on a support, and the recording layer comprises at least a coloration component (a), a coloration component (b) having a site for reacting with the coloration component (a) to produce color, the photopolymerizable composition of the invention, and if necessary other layers such as an undercoat layer, an intermediate layer, a light absorption layer, a protective layer and a back coat layer.

The basic embodiment of the recording material of the invention is not particularly limited and properly composed depending on the purposes.

Formation of images by applying the recording material of the invention, for example, to a positive-type photosensitive heat-sensitive recording material encapsulating the coloration component (a) in heat-responsive microcapsules in a fundamental mode is now described.

That is, the positive-type photosensitive recording material in this mode, upon irradiation with image-like light, generates a radical from the radical generator contained in the photopolymerizable composition in the region irradiated with the light, thus initiating the polymerization reaction of the polymerizable compound thereby curing and fixing the photopolymerizable composition in its position to form a latent image. Because the microcapsules at ordinary temperatures do not allow any materials to permeate therethrough, the coloration component (a) encapsulated in the microcapsules is in an uncolored state without contacting with the coloration component (b) having, in its molecule, a site for reacting with the coloration component (a) to produce color.

Afterwards, when heat is applied to the whole surface of the photosensitive and heat-sensitive recording material, the microcapsule is transformed to be substance-permeable and the color-forming component (b) in the light-unradiated area penetrates the microcapsule (and/or the color-forming component (a) is released to the outside of the microcapsule) and the color-forming components (a) and (b) are reacted with each other to color only in the light-unradiated area. While, in the light-radiated area, since the photopolymerizable composition is cured and fixed by polymerization reaction, the color-forming components (a) and (b) are both passivated and thus cannot be brought into contact with each other and therefore, no coloration takes place in the light-radiated area. After that, polymerization (fixation) is carried out even in the area where no polymerization takes place by carrying out entire surface exposure of the above-mentioned photosensitive and heat-sensitive recording material and the dye component contained in the photopolymerizable composition can be decolored.

Further, the recording material of the invention may be recording materials with the following embodiments (a first and a second embodiments) and image formation methods can be properly selected as well depending on the respective embodiments.

That is, in the recording material in the first mode, at least one copolymerizable compound contained in the photopolymerizable composition is the coloration component (b) itself, and the recording layer comprises at least the coloration component (a) and the photopolymerizable composition of the invention containing the coloration component (b) coloring the coloration component (a). In the positive-type photosensitive heat-sensitive recording material in the fundamental mode described above, the coloration component (b) has a site for coloring the coloration component (a) and also has an ethylenically unsaturated bond as described above, and upon irradiation with image-like light, the polymerization reaction of the coloration component (b) is initiated to fix the coloration component (b) in its position to form a latent image. Accordingly, the coloration component (b) in the region irradiated with light is immobilized, cannot contact with the coloration component (a), and does not produce color in the region irradiated with light.

In the recording material in the second mode of the invention, the recording layer comprises at least a coloration component (a), a coloration component (b) reacting with the coloration component (a) to produce color, and the photopolymerizable composition of the invention, wherein the polymerizable compound having an ethylenically unsaturated bond (polymerizable compound) contained in the photopolymerizable composition is a coloration inhibitory compound having, in the same molecule, a site for inhibiting the reaction of the coloration component (a) with the coloration component (b).

Formation of images by applying the recording material in the second mode, for example, to a negative-type photosensitive heat-sensitive recording material encapsulating the coloration component (a) in heat-responsive microcapsules is now described.

In the negative-type photosensitive heat-sensitive recording material in this mode, similar to the first mode, the microcapsules at ordinary temperatures do not allow any substances to permeate therethrough, and thus the coloration components (a) and (b) are in an uncolored state without contacting with each other. Upon irradiation of this photosensitive heat-sensitive recording material with image-like light, the polymerization reaction of the polymerizable compound in the region irradiated with the light is initiated thereby curing and fixing the polymerizable compound in its position to form a latent image. When the whole surface of the photosensitive heat-sensitive recording material is then heated, the microcapsules allow materials to permeate therethrough so that the coloration component (b) permeates into the microcapsules (and/or the coloration component (a) is released outside from the microcapsules), and simultaneously the polymerizable compound in the region not irradiated with light permeates as the coloration inhibitory compound into the microcapsules, thus inhibiting the coloration reaction between the coloration components (a) and (b). Accordingly, the region not irradiated with light is kept in an uncolored state. On the other hand, the polymerizable compound (coloration inhibitory compound) in the region irradiated with light has been fixed to its position by polymerization reaction, and is thus not involved in the reaction of the coloration components (a) and (b), to permit progress of the coloration reaction to produce color in only the region irradiated with light. Thereafter, the whole surface of the photosensitive heat-sensitive recording material can be irradiated with light to decolorize the dye contained in the photopolymerizable composition.

As the light source to be employed for the image formation using the recording material of the invention, similar light sources to those usable for the exposure of the above-mentioned photopolymerizable composition of the invention may be employed.

Hereinafter, the constituent components used in the recording material of the invention are described in detail.

(Photopolymerization Composition)

The photopolymerization comprises 1) a polymerizable compound having an ethylenically unsaturated bond (polymerizable compound), 2) a cyanine-based organic dye capable of decolorization (spectral sensitizing dye), and 3) a radical generator capable of interacting with the dye to generate a radical, and if necessary 4) other components, and the photopolymerizable composition of the invention is used in the recording material of the invention.

Upon irradiation of the photopolymerizable composition with light, the spectral sensitizing dye absorbs the light to interact with the radical generator, and the radical generator generates a radical. By this radical, the polymerizable compound is radical-polymerized and cured to form an image.

The polymerizable compound is as described above in detail, and a plurality of polymerizable compounds can be contained in the photopolymerizable composition. As shown in the recording material in the first mode, at least one of polymerizable compounds may be the coloration component (b) having a site for coloring the coloration component (a), and as described later, a coloration component having an ethylenically unsaturated bond (polymerizable group) in the same molecule is used.

On one hand, the polymerizable compound such as in the recording material in the second mode may also function as a coloration inhibitory compound, and a polymerizable compound having, in the same molecule, a site for inhibiting the reaction between the coloration component (a) and the coloration component (b) coloring the coloration component (a) is used.

Such polymerizable compound will be described later together with coloration components ((a) and (b)) etc. contained in the recording layer.

The content of the photopolymerizable composition in the recording layer is preferably 0.1 to 50 g/m$^2$, more preferably 1 to 30 g/m$^2$.

(Coloration Components)

In the recording material of the invention, the recording layer contains the coloration components (a) and (b) as the coloration source, together with the photopolymerizable composition. The recording material in the first mode contains the coloration component (a) together with the photopolymerizable composition, and the coloration component (b) contained as the polymerizable compound in the photopolymerizable composition reacts with the coloration component (a) to produce color.

A combination of the coloration components (a) and (b) as the coloration source constituting images includes the following combinations (1) to (19). In the following combination, the coloration component (a) and the coloration component (b) are shown in this order.

(1) a combination of an electron-donating dye precursor and an electron-receiving compound,
(2) a combination of a diazo compound and a coupling component (hereinafter referred to sometimes as "coupler compound"),
(3) a combination of a metal organic acid salt such as silver behenate or silver stearate and a reducing agent such as protocatechuic acid, spiroindane or hydroquinone,
(4) a combination of a long-chain fatty acid iron salt such as ferric stearate or ferric myristate and a phenol such as tannic acid, gallic acid or ammonium salicylate,
(5) a combination of a heavy metal/organic acid salt such as nickel, cobalt, lead, copper, iron, mercury or silver/acetate, stearate or palmitate and an alkali metal sulfide or alkaline earth metal sulfide such as calcium sulfide, strontium sulfide or potassium sulfide, or a combination of the heavy metal/organic acid salt and an organic chelating agent such as s-diphenyl carbazide or diphenyl carbazone,
(6) a combination of a heavy metal sulfate such as a silver, lead, mercury or sodium sulfate and a sulfur compound such as sodium tetrationate, sodium thiosulfate or thiourea,
(7) a combination of a ferric aliphatic acid salt such as ferric stearate and an aromatic polyhydroxy compound such as 3,4-hydroxytetraphenyl methane,
(8) a combination of an organic acid metal salt such as silver oxalate or mercury oxalate and an organic polyhydroxy compound such as polyhydroxy alcohol, glycerin or glycol,
(9) a combination of a ferric aliphatic acid salt such as ferric pelargonate or ferric laurate and a thiocesyl carbamide or isothiocesyl carbamide derivative,
(10) a combination of an organic acid lead salt such as lead caproate, lead pelargonate or lead behenate and a thiourea derivative such as ethylene thiourea or N-dodecyl thiourea,
(11) a combination of a higher aliphatic heavy metal salt such as ferric stearate or copper stearate and zinc dialkyldithiocarbamate,
(12) a combination of resorcin and a nitroso compound to form an oxazine dye,
(13) a combination of a formazan compound and a reducing agent and/or a metal salt,
(14) a combination of a protected dye (or a leuco dye) precursor and a deprotecting agent,
(15) a combination of an oxidizable coloring agent and an oxidizing agent,
(16) a combination of a phthalonitrile and a diiminoisoindoline (combination for forming phthalocyanine),
(17) a combination of an isocyanate and a diiminoisoindoline (combination for forming a colored pigment),
(18) a combination of a pigment precursor and an acid or base (combination for forming a pigment), and
(19) a combination of an oxidant precursor of a p-phenylene diamine derivative or a p-aminophenol derivative and a coupling compound (coupler compound).

The combinations of two components as the coloration source are preferably (1) a combination of an electron-donating dye precursor and an electro-receiving compound, (2) a combination of a diazo compound and a coupling component (hereinafter referred to sometimes as "coupler compound"), (14) a combination of a protected dye (or a leuco dye) precursor and a deprotecting agent, and (19) a combination of an oxidant precursor of a p-phenylene diamine derivative or a p-phenol derivative and a coupling compound (coupler compound). That is, the coloration component (a) is preferably an electron-donating dye precursor, a diazo compound, a dye precursor or an oxidant precursor, and the coloration component (b) is preferably an electro-receiving compound, a coupler compound or a deprotecting agent.

In the case an electron-donating colorless dye precursor is used as the color-forming component (a), examples of the electron-donating colorless dye precursor include a variety of types of compounds already known in thermal recording paper and pressure sensitive paper such as phthalide compounds, fluorane compounds, phenothiazine compounds, indolylphthalide compounds, leuco auamine compounds, rhodamine lactam compounds, triphenylmethane compounds, triazene compounds, spiropyrane compounds, pyridine compounds, pyrazine compounds and fluorene compounds.

The phthalide-based compound include, for example, compounds described in U.S. republished Pat. No. 23,024, U.S. Pat. Nos. 3,491,111, 3,491,112, 3,491,116, and 3,509,174 and specific examples include 3,3-bis(p-dimethylaminophenyl)-6-dimethylaminophthalide, 3,3-bis(p-diethylaminophenyl)phthalide, 3,3-bis(2-methyl-1-octylindol-3-yl)phthalide, 3-(4-dipropylamino-2-acetylaminophenyl)-3-(2-methyl-1-octylindol-3-yl)-4-azaphthalide, 3-(4-diethylamino-2-ethoxyphenyl)-3-(2-methyl-1-octylindol-3-yl)phthalide, 3-(4-diethylamino-2-ethoxyphenyl)-3-(2-methyl-1-octylindol-3-yl)-4-azaphthalide, 3-(4-diethylamino-2-methylphenyl)-3-(1-ethyl-2-methylindol-3-yl)-4-azaphthalide, 3,3-bis(4-diethylamino-2-butyloxyphenyl)-4-azaphthalide and 3-(4-diethylamino-2-butyloxyphenyl)-3-(2-methyl-1-pentylindol-3-yl)-4-azaphthalide.

Examples of the fluoran compounds include those described in for example U.S. Pat. Nos. 3,624,107, 3,627,787, 3,641,011, 3,462,828, 3,681,390, 3,920,510 and 3,959,571, and specific examples include 2-anilino-3-methyl-6-diethylaminofluoran, 2-anilino-3-methyl-6-dibutylaminofluoran, 2-anilino-3-methyl-6-N-ethyl-N-isoamylaminofluoran, 2-anilino-3-methyl-6-N-ethyl-N-cyclohexylaminofluoran, 2-anilino-3-methyl-6-N-ethyl-N-isobutylaminofluoran, 2-anilino-6-dibutylaminofluoran, 2-anilino-3-methyl-6-N-methyl-N-tetrahydrofurfurylaminofluoran, etc.

Examples of the thiazine compound include benzoyl Leucomethylene Blue and p-nitrobenzyl Leucomethylene Blue.

The leucoauramine compounds include, for example, 4,4'-bis-dimethylaminobenzhydrynbenzyl ether, N-halophenyl-leucoauramine and N-2,4,5-trichlorophenylleucoauramine etc.

The rhodamine lactam compounds include, for example, rhodamine-B-anilinolactam, rhodamine(p-nitrino)lactam etc.

Examples of the spiropyrane compound include compounds described in U.S. Pat. No. 3,971,808 and specific examples are 3-methyl-spiro-dinaphtopyrane, 3-ethyl-spiro-dinaphthopyrane, 3,3'-dichloro-spiro-dinaphthopyrane, 3-benzylspiro-dinaphthopyrane, 3-methyl-naphtho-(3-methoxbenzo)spiropyrane and 3-propyl-spiro-dibenzopyrane.

Examples of the pyridine compound and pyrazine compound include compounds described in U.S. Pat. Nos. 3,775,424, 3,853,869, and 4,246,318.

Examples of the fluorene compounds include those described in for example in JP-A No. 63-94878.

As dye precursors for cyan, magenta and yellow coloration, dye precursors described in U.S. Pat. No. 4,800,149 can be used.

Dye precursors described in U.S. Pat. Nos. 4,800,148, 5,126,233 and JP-B No. 7-88105 can also be used as the electron-donating dye precursors for yellow coloration, and dye precursors disclosed in JP-A No. 63-53542 can also be used as the electron-donating dye precursors for cyan coloration.

When the electron-donating dye precursor is used, an electron-receiving compound is used as the coloration component (b) coloring the electron-donating dye precursor.

The electron-receiving compound includes electron-receiving compounds known in heat-sensitive paper and pressure-sensitive paper, for example, phenol derivatives, salicylic acid derivatives, metal aromatic carboxylates, acid clay, bentonite, novolak resin, metal-treated novolak resin, metal complexes etc. These compounds are described in, for example, JP-B Nos. 40-9309, 45-14039, JP-A Nos. 52-140483, 48-51510, 57-210886, 58-87089, 59-11286, 60-176795, and 61-95988.

Regarding the above-mentioned compounds, examples of the phenol derivative include 2,2-bis(4-hydroxyphenyl)propane, 1,1-bis(3-chloro-4-hydroxyphenyl)cyclohexane, 4-hydroxyphenyl-4'-isopropyloxyphenyl sulfone, bis(3-allyl-4-hydroxyphenyl)sulfone, α,α'-bis(4-hydroxyphenyl)1,4-diisopropylbenzene and benzyl p-hydroxybenzate.

Examples of the salicylic acid derivative include 4-pentadecylsalicylic acid, 3,5-di(α-methylbenzyl)salicylic acid, 3,5-di(tert-octyl)salicylic acid, 5-octadecylsalicylic acid, 5-α-(p-α-methylbenzylphenyl)ethylsalicylic acid, 3-α-methylbenzyl-5-tert-octylsalicylic acid, 5-tetradecylsalicylic acid, 4-hexyloxysalicylic acid, 4-cyclohexyloxysalicylic acid, 4-decyloxysalicylic acid, 4-dodecyloxysalicylic acid, 4-pentadecyloxysalicylic acid, 4-octadecyloxysalicylic acid, and their zinc, aluminum, calcium and copper salts like.

In the above-mentioned recording material of the first embodiment, the color-forming component B also functions as a polymerizable compound having an ethylenic unsaturated bond. Accordingly, at least one of polymerizable compounds in the recording material of the first embodiment is an electron-accepting compound which contains an electron-accepting group and an ethylenic unsaturated bond (hereinafter, referred to as a polymerizable group) in the molecule.

The coloration component (b) in this case includes, for example, 3-halo-4-hydroxybenzoic acid described in JP-A No. 4-226455, methacryloxyethyl or acryloxyethyl benzoate having a hydroxy group described in JP-A No. 63-173682, hydroxymethylstyrene benzoate having a hydroxyl group described in JP-A Nos. 59-83693, 60-141587 and 62-99190, hydroxystyrene described in EP Patent No. 29323, zinc halide/N-vinyl imidazole complexes described in JP-A Nos. 62-167077 and 62-16708, and compounds which can be synthesized by reference to electro-receiving compounds described in JP-A No. 63-317558.

Preferable among these compounds having an electroreceiving group and a polymerizable group in the same molecule are 3-halo-4-hydroxybenzoic acid derivatives (esters) represented by the following formula:

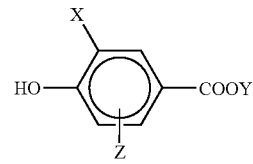

wherein X represents a halogen atom, preferably a chlorine atom; Y represents a monovalent group having a polymerizable ethylene group, preferably a vinyl-containing aralkyl, acryloyloxyalkyl or methacryloyloxyalkyl group, more preferably a C5 to C11 acryloyloxyalkyl group or a C6 to C12 methacryloyloxyalkyl group; and Z represents a hydrogen atom, an alkyl group or an alkoxy group.

Preferable examples of the 3-halo-4-hydroxybenzoic acid include, for example, vinyl phenethyl 3-chloro-4-hydroxybenzoate, vinyl phenyl propyl 3-chloro-4-hydroxybenzoate, (2-acryloyloxyethyl) 3-chloro-4-hydroxybenzoate, (2-methacryloyloxyethyl) 3-chloro-4-hydroxybenzoate, (2-acryloyloxypropyl) 3-chloro-4-hydroxybenzoate, (2-methacryloyloxypropyl) 3-chloro-4-hydroxybenzoate, (3-acryloyloxypropyl) 3-chloro-4-hydroxybenzoate, (3-methacryloyloxypropyl) 3-chloro-4-hydroxybenzoate; 3-chloro-4-hydroxybenzoic acid (4-acryloyloxybutyl) ester, 3-chloro-4-hydroxybenzoic acid (4-methacryloyloxybutyl) ester, 3-chloro-4-hydroxybenzoic acid (2-acryloyloxyethyl) ester, 3-chloro-4-hydroxybenzoic acid (5-acryloyloxypentyl) ester, 3-chloro-4-hydroxybenzoic acid (5-methacryloyloxypentyl) ester, 3-chloro-4-hydroxybenzoic acid (6-acyloyloxyhexyl) ester, 3-chloro-4-hydroxybenzoic acid (6-methacryloyloxyhexyl) ester, 3-chloro-4-hydroxybenzoic acid (8-acryloyloxyocty) ester, 3-chloro-4-hydroxybenzoic acid (8-methacryloyloxy) ester and the like.

Further examples include styrenesulfonylaminosalicylic acid, vinylbenzyloxyphthalic acid, zinc β-methacryloxyethoxy salicylate, zinc β-acryloxyethoxy salicylate, vinyloxyethyloxy benzoic acid, β-methacryloxyethyl orsellinate, β-acryloxyethyl orsellinate, β-methacryloxyethoxy phenol, β-acryloxyethoxy phenol;

β-methacryloxyethyl-β-resorcinate, β-acryloxyethyl-β-resorcinate, hydroxystyrene sulfonic acid-N-ethylamide, β-methacryloxypropyl-p-hydroxybenzoate, β-acryloxypropyl-p-hydroxybenzoate, methacryloxy methyl phenol, acryloxy methyl phenol, methacrylamide propane sulfonic acid, acrylamide propane sulfonic acid, β-methacryloxyethoxydihydroxybenzene, β-acryloxyethoxy-dihydroxybenzene, γ-styrenesulfonyloxy-β-methacryloxypropane carboxylic acid;

γ-acryloxypropyl-α-hydroxyethyloxy salicylic acid, β-hydroxyethoxynyl phenol, β-methacryloxyethyl-p-hydroxy cinnamate, β-acryloxyethyl-p-hydroxy cinnamate, 3,5-distyrene sulfonic acid amide phenol, methacryloxyethoxy phthalic acid, acryloxyethoxy phthalic acid, methacrylic acid, acrylic acid, methacryloxy ethoxy hydroxy naphthoic acid, acryloxy ethoxy hydroxy naphthoic acid;

3-β-hydroxyethoxyphenol, β-methacryloxyethyl-p-hydroxybenzoate, β-acryloxyethyl-p-hydroxybenzoate, β'-methacryloxyethyl-β-resorcinate, β-methacryloxyethyloxycarbonylhydroxybenzoic acid, β-acryloxyethyloxycarbonylhydroxybenzoic acid, N,N'-di-β-methacryloxyethylaminosalicylic acid, N,N'-di-β-acryloxyethylaminosalicylic acid, N,N'-di-β-methacryloxyethylaminosulfonylsalicylic acid, N,N'-di-β-acryloxyethylaminosulfonylsalicylic acid, and their metal salts thereof (e.g. zinc salts).

When the electron-donating dye precursor and the electro-receiving compound are used as the coloration components (a) and (b) respectively, the content of the electron-donating dye precursor in the recording layer is preferably 0.05 to 5 g/m², more preferably 0.1 to 3 g/m².

The amount of the electro-receiving compound used is preferably 0.5 to 20 parts by weight, more preferably 3 to 10 parts by weight, based on 1 part by weight of the electron-donating colorless dye used. When the amount is lower than 0.5 part by weight, sufficient color density cannot be obtained in some cases, while when the amount is higher than 20 parts by weight, sensitivity may be lowered and coating properties may be deteriorated.

When a diazo compound is used as the coloration component (a), it is preferable to employ a diazo compound represented by the following formula:

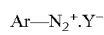

Ar—$N_2^+$·$Y^-$ wherein Ar represents an aromatic cyclic group, and $Y^-$ represents an acid anion.

In the above formula, Ar represents a substituted or unsubstituted aryl group. Its substituent group includes an alkyl group, alkoxy group, alkylthio group, aryl group, aryloxy group, arylthio group, acyl group, alkoxycarbonyl group, carbamoyl group, carboamide group, sulfonyl group, sulfamoyl group, sulfonamide group, ureido group, halogen group, amino group, heterocyclic group, etc., and these substituent groups may be further substituted.

The aryl group is preferably a C6 to C30 aryl group, and examples include a phenyl group, 2-methylphenyl group, 2-chlorophenyl group, 2-methoxyphenyl group, 2-butoxyphenyl group, 2-(2-ethylhexyloxy)phenyl group, 2-octyloxyphenyl group, 3-(2,4-di-t-pentylphenoxyethoxy)phenyl group, 4-chlorophenyl group, 2,5-dichlorophenyl group, 2,4,6-trimethylphenyl group, 3-chlorophenyl group, 3-methylphenyl group, 3-methoxyphenyl group, 3-butoxyphenyl group, 3-cyanophenyl group, 3-(2-ethylhexyloxy)phenyl group, 3,4-dichlorophenyl group, 3,5-dichlorophenyl group, 3,4-dimethoxyphenyl group; 3-(dibutylaminocarbonylmethoxy)phenyl, 4-cyanophenyl, 4-methylphenyl, 4-methoxyphenyl, 4-butoxyphenyl, 4-(2-ethylhexyloxy)phenyl, 4-benzylphenyl, 4-aminosulfonylphenyl, 4-N,N-dibutylaminosulfonylphenyl, 4-ethoxycarbonylphenyl, 4-(2-ethylhexylcarbonyl)phenyl, 4-fluorophenyl, 3-acetylphenyl, 2-acetylaminophenyl, 4-(4-chlorophenylthio)phenyl, 4-(4-methylphenyl)thio-2,5-butoxyphenyl and 4-(N-benzyl-N-methylamino)2-dodecyloxycarbonylphenyl.

These groups may be further substituted with an alkyloxy, an alkylthio, a substituted phenyl, a cyano, a substituted amino, a halogen, a heterocyclic group and the like.

Preferable examples of the diazo compound to be used as the color-forming component A include diazo compounds exemplified in the 44th to 49th paragraphs in JP-A No. 7-276808. However, in the invention, the diazo compound is not limited to those compounds.

The maximum absorption wavelength λmax of the diazo compound is preferably 450 nm or shorter and more preferably to be 290 to 440 nm in views of the effects. Further, the diazo compounds preferably contains 12 or more carbon atoms and has 1% or less solubility in water, and 5% or more solubility in ethyl acetate.

As the coloration component (a), the diazo compounds may be used alone or as a mixture of two or more thereof depending on purposes such as regulation of hue, etc.

When the diazo compound is used, a coupler compound (not having a polymerizable group) or a coupler compound having a polymerizable group is used as the coloration component (b).

The two coupler compounds couple with the diazo compound in a basic atmosphere and/or a neutral atmosphere to form dyes, and several kinds of coupler compounds can be simultaneously used depending on various purposes such as regulation of hue etc.

Examples of the coupler compound having a polymerizable group include an active methylene compound having a methylene group adjacent to a carbonyl group, a phenol derivative, a naphthol derivative, an azole derivative, a hetero-condensed ring azole derivative, etc. These can be selected and used in such a range as to meet the object of the invention.

An active methylene compound having a methylene group adjacent to a carbonyl group, a phenol derivative, a naphthol derivative, an azole derivative or a hetero-condensed ring azole derivative is preferably used as the coupler skeleton compound (coupler) in the coupler compound having a polymerizable group. Specific examples include resorcin, phloroglucine, 2,3-dihydroxynaphthalene, sodium 2,3-dihydroxynaphthalene-6-sulfonate, 1-hydroxy-2-naphthoic acid morpholinopropylamide, sodium 2-hydroxy-3-naphthalene sulfonate, 2-hydroxy-3-naphthalene sulfonic acid anilide, 2-hydroxy-3-naphthalene sulfonic acid morpholinopropyl amide, 2-hydroxy-3-naphthalene sulfonic acid-2-ethylhexyloxy propylamide, 2-hydroxy-3-naphthalene sulfonic acid-2-ethylhexylamide, 5-acetamide-1-naphthol;

sodium 1-hydroxy-8-acetamide naphthalene-3,6-disulfonate, 1-hydroxy-8-acetamide naphthalene-3,6-disulfonic acid dianilide, 1,5-dihydroxynaphthalene, 2-hydroxy-3- naphthoic acid morpholinopropylamide, 2-hydroxy-3-naphthoic acid octylamide, 2-hydroxy-3-naphthoic acid anilide, 5,5-dimethyl-1,3-cyclohexane dione, 1,3-cyclopentane dione, 5-(2-n-tetradecyloxyphenyl)-1,3-cyclohexane dione, 5-phenyl-4-methoxycarbonyl-1,3-cyclohexane dione, 5-(2,5-di-n-octyloxyphenyl)-1,3-cyclohexane dione, N,N'-dicyclohexyl barbituric acid, N,N'-di-n-dodecyl barbituric acid;

N-n-octyl-N'-n-octadecylbarbituric acid, N-phenyl-N'-(2,5-di-n-octyloxyphenyl)barbituric acid, N,N'-bis(octadecyloxycarbonylmethyl)barbituric acid, 1-phenyl-3-methyl-5-pyrazolone, 1-(2,4,6-trichlorophenyl)-3-anilino-5-pyrazolone, 1-(2,4,6-trichlorophenyl)-3-benzamido-5-pyrazolone, 6-hydroxy-4-methyl-3-cyano-1-(2-ethylhexyl)-2-pyridone, 2,4-bis(benzoylacetamido)toluene, 1,3-bis(pivaloylacetamidomethyl)benzene, benzoylacetonitrile, thenoylacetonitrile, acetoacetoanilide, benzoylacetoanilide, pivaloylacetoanilide, 2-chloro-5-(N-n-butylsulfamoyl)-1-pivaloylacetamidobenzene, 1-(2-ethylhexyloxypropyl)-3-cyano-4-methyl-6-hydroxy-1,2-dihydropyridin-2-one, 1-(dodecyloxypropyl)-3-acetyl-4-methyl-6-hydroxy-1,2-dihydropyridin-2-one and 1-(4-n-octyloxyphenyl)-3-tert-butyl-5-aminopyrazole.

Details of the coupler compounds can be found by referring to the compounds described in JP-A Nos. 4-201483, 7-223367, 7-223368, 7-323660, 5-278608, 5-297024, 6-18669, 6-18670, 7-316280, 9-216468, 9-216469, 9-319025, 10-035113, 10-193801, 10-264532, and the like.

The coupler compounds form dyes by coupling with a diazo compound in basic atmosphere and/or neutral atmosphere and a plurality of types may be used in combination depending on various purposes such as hue adjustment and the like.

Hereinafter, specific examples of the coupler having a polymerizable group are shown, but the invention is not limited thereto.

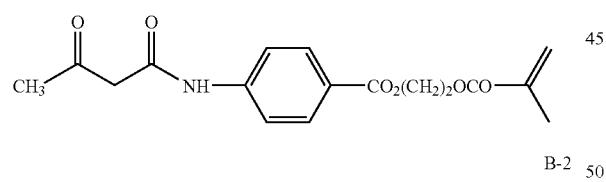
B-1

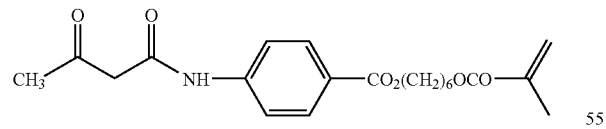
B-2

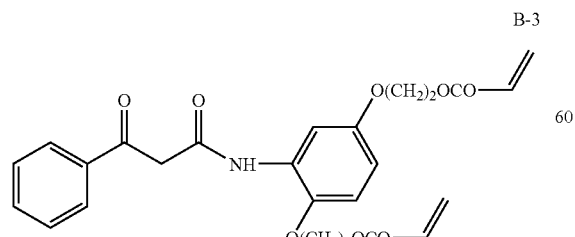
B-3

-continued

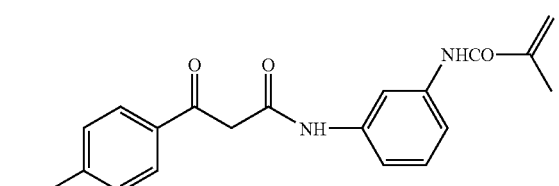
B-4

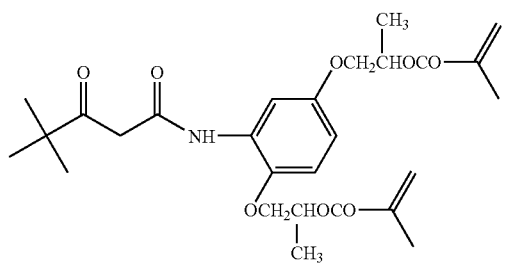
B-5

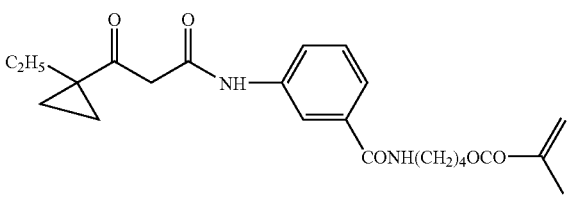
B-6

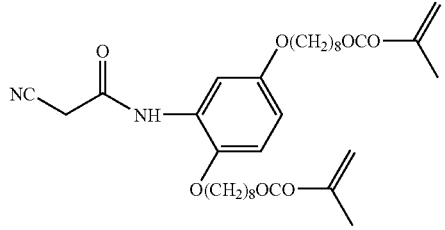
B-7

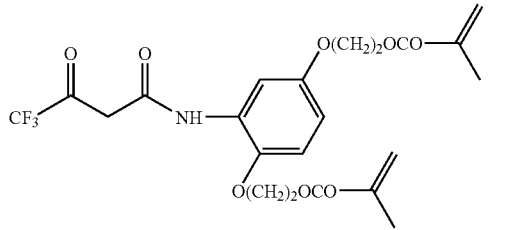
B-8

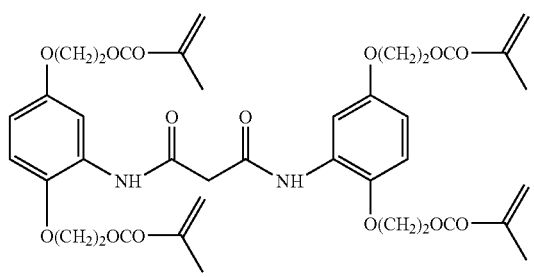
B-9

-continued
B-10
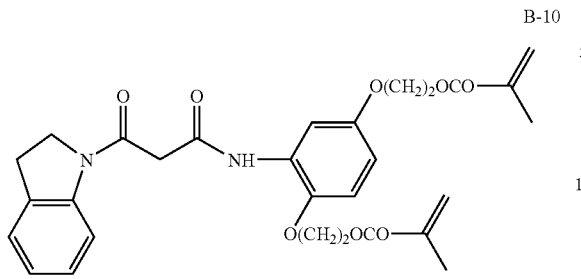
B-11
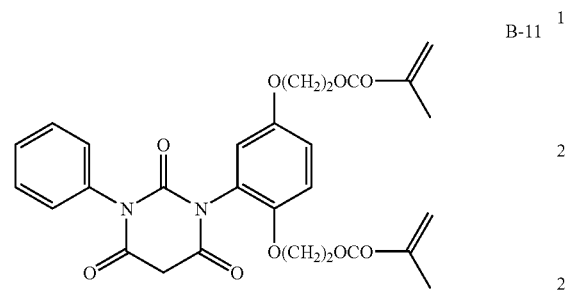
B-12
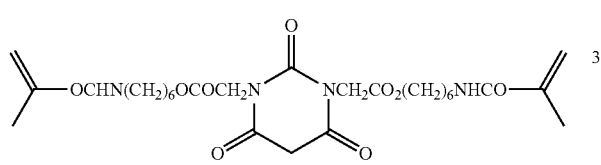
B-13
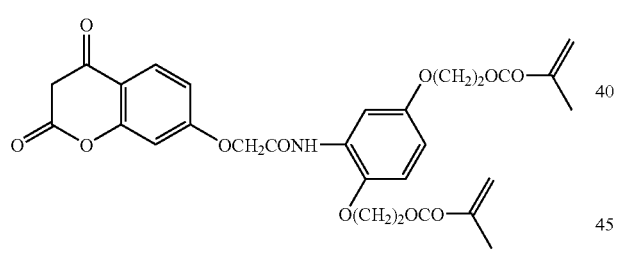
B-14
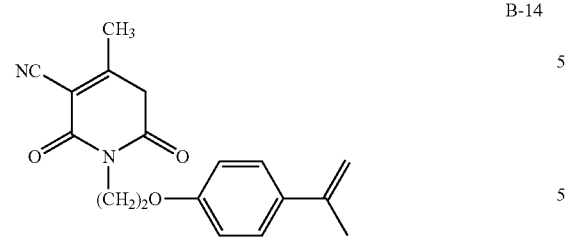
B-15
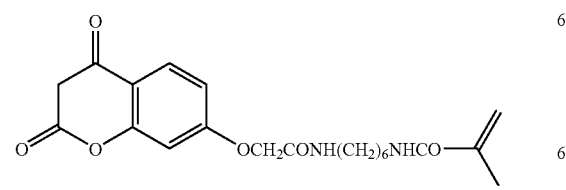
-continued
B-16
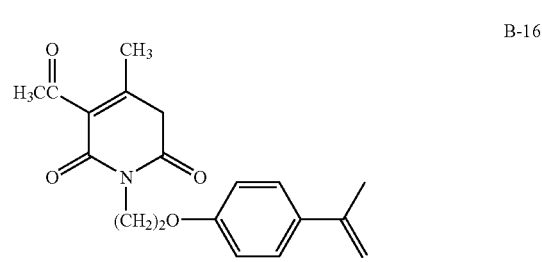
B-17
B-18
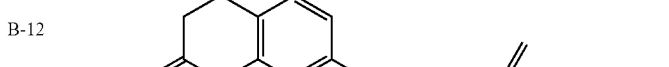
B-19
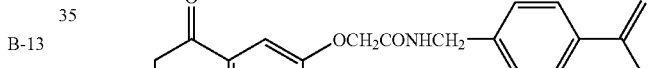
B-20
B-21
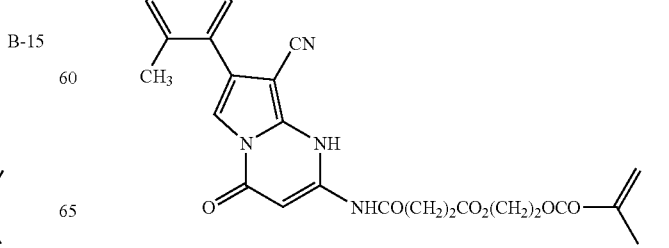

B-22 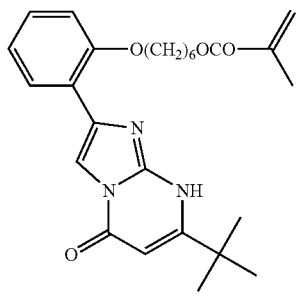
B-23 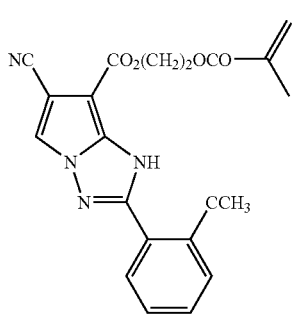
B-24 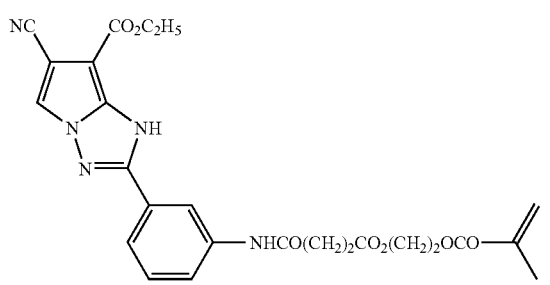
B-25 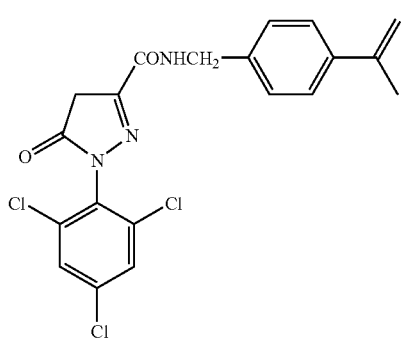
B-26 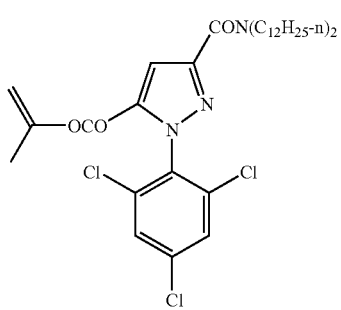
B-27 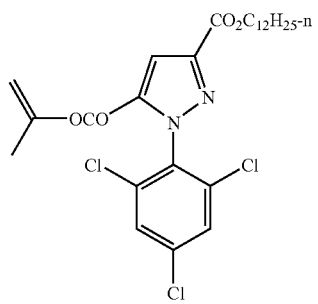
B-28 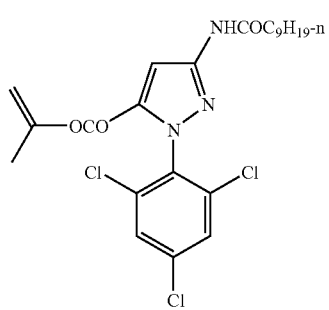
B-29 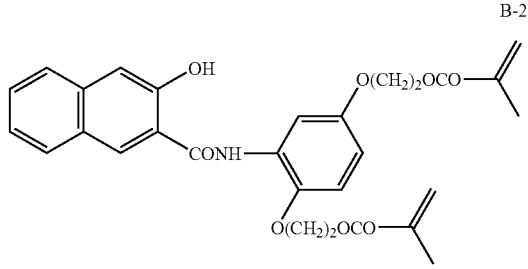
B-30 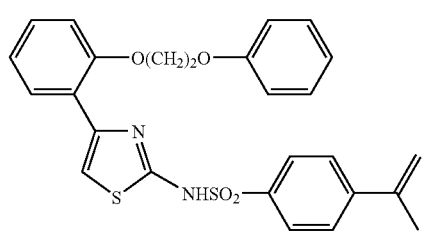
B-31 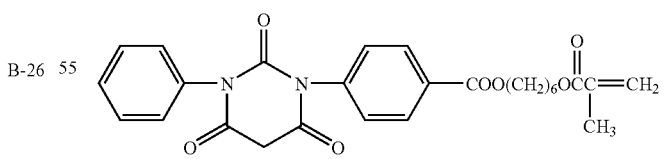
B-32 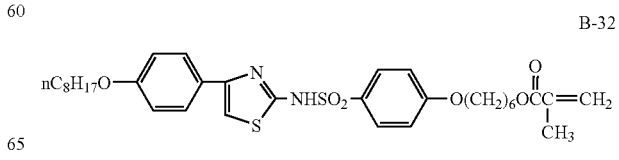

-continued

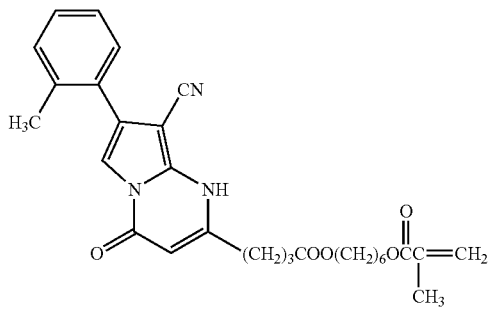

B-33

Specific examples of the coupler compound having no polymerizable group include the compounds exemplified as the coupler skeleton compounds in the above-mentioned coupler compound, which has a polymerizable group.

When the diazo compound is used as the coloration component (a) while the coupler is used as the coloration component (b), the content of the diazo compound in the recording layer is preferably 0.02 to 5.0 g/m$^2$, more preferably 0.05 to 3.0 g/m$^2$.

When the content is lower than 0.02 g/m$^2$, sufficient color density cannot be obtained in some cases, while when the content is higher than 5.0 g/m$^2$, the coating properties of the coating solution may be deteriorated.

Further, the amount of the above-mentioned coupler compound used is preferably 0.5 to 20 parts by mass and more preferably 1 to 10 parts by mass to 1 part by mass of the above-mentioned diazo compound. If the amount used is less than 0.5 parts by mass, sufficient coloration might not be obtained and if it exceeds 20 parts by mass, the application suitability might deteriorate.

The coupler compound to be used as the color-forming component (b) may be added to a water-soluble polymer and other components to be used and solid-dispersed by a sand mill, and may also be used in the form of an emulsion by being emulsified together with a appropriate emulsification auxiliary agent. The method for solid-dispersion or emulsification is not particularly limited and any well-known method may be employed. The details of the methods are described in JP-A Nos. 59-190886, 2-141279, and 7-17145.

For the purpose of promoting a coupling reaction between a diazo compound and a coupler, it is preferable to use organic base compounds such as tertiary amines, piperidines, piperazines, amizines, formamizines, pyridines, guanidines, morpholines and the like.

The organic base includes, for example, [piperazine derivatives such as] N,N'-bis(3-phenoxy-2-hydroxypropyl) piperazine, N,N'-bis[3-(p-methylphenoxy)-2-hydroxypropyl]piperazine, N,N'-bis[3-(p-methoxyphenoxy)-2-hydroxypropyl]piperazine, N,N'-bis(3-phenylthio-2-hydroxypropyl)piperazine, N,N'-bis[3-(β-naphthoxy)-2-hydroxypropyl]piperazine, N-3-(β-naphthoxy)-2-hydroxypropyl-N'-methylpiperazine, piperazines such as 1,4-bis{[3-(N-methylpiperadino)-2-hydroxy]propyloxy}benzene and the like; morpholines such as N[3-(β-naphthoxy)-2-hydroxy]propylmorpholine, 1,4-bis[(3-morpholino-2-hydroxy)propyloxy]benzene, and 1,3-bis[(3-morpholino-2-hydroxy)propyloxy]benzene and the like; piperidines such as N-(3-phenoxy-2-hydroxypropyl)piperidine, N-dodecylpiperidine and the like; triphenylguanidine, tricyclohexylguanidine, dicyclohexylphenylguanidine, 4-hydroxybenzoic acid 2-N-methyl-N-benzylaminoethyl ester, 4-hydroxybenzoic acid 2-N,N-di-n-butylaminoethyl ester, 4-(3-N,N-dibutylamnopropoxy)benzenesulfonamide, 4-(2-N,N-dibutylaminoethoxycarbonyl)phenoxyacetic acid amide and the like.

These organic bases may be used alone or as a mixture of two or more thereof.

These organic bases are described in JP-A Nos. 57-123086, 60-49991, 60-94381, 9-71048, 9-77729, and 9-77737. In the case when the above-mentioned organic base compounds are used, organic base compounds having a polymerizable group may be used as the organic base compounds.

When the organic base having a polymerizable group is used in the recording material in the first mode, both the diazo compound and coupler are contained as the coloration component (a) in microcapsules, while the organic base having a polymerizable group can function as the coloration component (b). When the diazo compound and coupler are encapsulated as the coloration component (a) in microcapsules, the diazo compound and coupler are used in such a combination as to initiate coloration reaction in the presence of a base.

In the recording material in the first mode, the diazo compound is used as the coloration component (a), while a coupler having a polymerizable group and the organic base having a polymerizable group may be simultaneously used as the coloration component (b).

The amount of the organic base used is not particularly limited, but is preferably in the range of 1 to 30 moles per mole of the diazo compound.

For the purpose of promoting the coloration reaction, a coloration assistant can also be added. The coloration assistant includes phenol derivatives, naphthol derivatives, alkoxy-substituted benzene, alkoxy-substituted naphthalene, hydroxy compounds, carboxylic acid amide compounds, sulfonamide compounds etc.

Now, the polymerizable compound used in the recording material used in the second mode is described.

The recording material in the second mode contains, in its recording layer, a coloration inhibitory compound as a polymerizable compound having, in the same molecule, an ethylenically unsaturated bond and a site for inhibiting the reaction between the coloration component (a) and the coloration component (b) reacting with the coloration component (a) to produce color (hereinafter, also referred to as "polymerizable coloration inhibitory compound").

When an electron-donating dye precursor is used as the coloration component (a) and an electro-receiving compound not having a polymerizable group is used as the coloration component (b), the polymerizable coloration inhibitory compound used is preferably a photopolymerizable monomer having, in its molecule, at least one vinyl group and a site for inhibiting the reaction of the electron-donating dye precursor with the electro-receiving compound (hereinafter, also referred to as "photopolymerizable monomer D,").

Specific examples of the above-mentioned photopolymerizable monomer DI include acrylic acid and its salts, acrylic acid esters, acrylamides; methacrylic acids and salts thereof, methacrylic acid esters, methacrylamides; maleic anhydride, maleic acid esters; itaconic acid, itaconic acid esters; styrenes; vinyl ethers; vinyl esters; N-vinyl-heterocyclic compounds; aryl ethers; and allyl esters.

Among these, compounds having a plurality of vinyl groups in a molecule are preferable and specifically, acrylic acid esters and/or methacrylic acid esters with polyhydric alcohols such as trimethylolpropane, pentaerythritol and the like; acrylic acid esters and/or methacrylic acid esters with polyhydric phenols and bisphenols such as resorcinol, pyrogallol, phloroglucinol, and the like; acrylate or methacrylate-terminated epoxy resin; acrylate or methacrylate-terminated polyesters are preferable.

Particularly preferable among those described above are ethylene glycol diacrylate, ethylene glycol dimethacrylate, trimethylol propane triacrylate, pentaerythritol tetraacrylate, dipentaerythritol hydroxy pentaacrylate, hexanediol-1,6-dimethacrylate, diethylene glycol dimethacrylate etc.

The photopolymerizable monomer $D_1$ is preferably the one having a molecular weight of about 100 to about 5000, more preferably about 300 to about 2000.

In the case when the above-mentioned photopolymerizable monomer $D_1$ is used as the above-mentioned polymerizable color formation suppressing compound, the amount used is preferably 0.1 to 10 parts by mass and more preferably 0.5 to 5 parts by mass to 1 part by mass of the electron-donating compound to be used in combination with the coupler compound having no polymerizable group. If the above-mentioned use amount is less than 0.1 parts by mass, a latent image might not be formed in the exposure step and if it exceeds 10 parts by mass, the color density might decrease.

When the diazo compound is used as the coloration component (a) and the coupler compound not having a polymerizable group is used as the coloration component (b), the polymerizable coloration inhibitory compound is preferably a photopolymerizable monomer having an acidic group inhibiting the coupling reaction of the diazo compound with the coupler compound and at least one vinyl group in its molecule (hereinafter referred to "photopolymerizable monomer $D_2$").

Preferable examples of the photopolymerizable monomer $D_2$ include styrenesulfonylaminosalicylic acid, vinylbenzyloxyphthalic acid, zinc β-methacryloxyethoxy salicylate, zinc β-acryloxyethoxy salicylate, vinyloxyethyloxy benzoic acid, β-methacryloxyethyl orsellinate, β-acryloxyethyl orsellinate, β-methacryloxyethoxy phenol, β-acryloxyethoxy phenol, β-methacryloxyethyl-β-resorcinate, β-acryloxyethyl-β-resorcinate, hydroxystyrene sulfonic acid-N-ethylamide, β-methacryloxypropyl-p-hydroxybenzoate, β-acryloxypropyl-p-hydroxybenzoate, methacryloxy methyl phenol, acryloxy methyl phenol, methacrylamide propane sulfonic acid, acrylamide propane sulfonic acid, β-methacryloxyethoxy-dihydroxybenzene, β-acryloxyethoxy-dihydroxybenzene, γ-styrenesulfonyloxy-β-methacryloxypropane carboxylic acid;

γ-acryloxypropyl-α-hydroxyethyloxy salicylic acid, β-hydroxyethoxynyl phenol, β-methacryloxyethyl-p-hydroxy cinnamate, β-acryloxyethyl-p-hydroxy cinnamate, 3,5-distyrene sulfonic acid amide phenol, methacryloxyethoxy phthalic acid, acryloxyethoxy phthalic acid, methacrylic acid, acrylic acid, methacryloxy ethoxy hydroxy naphthoic acid, acryloxy ethoxy hydroxy naphthoic acid, 3-β-hydroxy ethoxy phenol, β-methacryloxyethyl-p-hydroxy benzoate, β-acryloxyethyl-p-hydroxy benzoate;

β'-methacryloxyethyl-β-resorcinate, β-methacryloxyethyloxy carbonyl hydroxy benzoic acid, β-acryloxyethyloxycarbonyl hydroxy benzoic acid, N,N'-di-β-methacryloxyethylamino salicylic acid, N,N'-di-acryloxyethylamino salicylic acid, N,N'-di-β-methacryloxyethylaminosulfonyl salicylic acid, N,N'-di-β-acryloxyethylaminosulfonyl salicylic acid, etc.

In the case when the above-mentioned photopolymerizable monomer $D_2$ is used as the above-mentioned polymerizable color formation suppressing compound, the amount used is preferably 0.1 to 10 parts by mass and more preferably 0.5 to 5 parts by mass to 1 part by mass of the coupler compound to be used in combination with the coupler compound having no polymerizable group. If the above-mentioned use amount is less than 0.1 parts by mass, an latent image might not be formed in the exposure step and if it exceeds 10 parts by mass, the color density might be decreased.

(Microcapsules)

In the recording material of the invention, the coloration component (a) is contained preferably in a state encapsulated in microcapsules in the recording layer.

As the microcapsulation method, conventional methods can be used. Example of such methods include a method of utilizing coacervation of a hydrophilic wall forming material as shown in U.S. Pat. Nos. 2,800,457 and 28,000,458, a method of interfacial polymerization as shown in U.S. Pat. No. 3,287,154, U.K. Patent No. 990443, JP-B Nos. 38-19574, 42446 and 42-771, a method of precipitating polymers as shown in U.S. Pat. Nos. 3,418,250 and 3,660,304, a method of using an isocyanate polyol wall material as shown in U.S. Pat. No. 3,796,669, a method of using an isocyanate wall material as shown in U.S. Pat. No. 3,914,511, a method of using an urea-formaldehyde type or urea-formaldehyde-resorcinol type wall-forming material as shown in U.S. Pat. Nos. 4,001,140, 40,87,376 and 4,089,802, a method of using a wall material such as melamine-formaldehyde resin and hydroxypropyl cellulose as shown in U.S. Pat. No. 4,025,455, a method of in situ polymerization of monomers as shown in JP-B No. 36-4168 and JP-A No. 51-9079, a method of electrolytic dispersion cooling as shown in U.K. Patent Nos. 952807 and 965074 and a method of spray drying as shown in U.S. Pat. No. 3,111,407 and U.K. Patent No. 930422.

The method for encapsulation is not limited to these methods, however, an interface polymerization method comprising steps of mixing an oil phase produced by dissolving or dispersing the color-forming component (a) in a hydrophobic organic solvent, which will become a core of the capsule, with a water phase dissolving a water-soluble polymer, emulsifying and dispersing the mixture by means such as a homogenizer or the like and then causing a polymer forming reaction at an oil droplet interface by heating the mixture to form a microcapsule wall of the polymer substance is especially preferable. With this method, capsules with uniform particle diameter can be formed within a short time and accordingly the recording material can be provided with excellent raw storage property.

The reactants for forming the polymer may be added to the inside of the oil droplets and/or the outside of the oil droplets. Specific examples of the polymer substance include polyurethanes, polyureas, polyamides, polyesters, polycarbonates, urea-formaldehyde resin, melamine resin, polystyrenes, styrene-methacrylate copolymers and styrene-acrylate copolymers. Among these, polyurethanes, polyureas, polyamides, polyesters, and polycarbonates are preferable and polyurethanes and polyureas are especially preferable. Two or more types of the above-mentioned polymer substances may be used in combination.

Examples of the above-mentioned water-soluble polymer include gelatin, polyvinyl pyrrolidone and polyvinyl alcohol. For example, in the case when a polyurethane is used for the capsule wall material, a polyvalent isocyanate and a second substance, which forms a capsule wall by reacting with the isocyanate (e.g. a polyol, a polyamine) are mixed in an aqueous solution of a water-soluble polymer (water phase) or an oleophilic solvent (oil phase) to be encapsulated and the mixture is emulsified and dispersed and then heated to cause a polymer forming reaction in the oil droplet interface and consequently, the microcapsule wall can be formed.

The above-mentioned polyvalent isocyanate and the counterpart polyol, polyamine to be reacted to the isocyanate may be selected from those described in U.S. Pat. Nos. 3,281,383, 3,773,695, and 3,793,268, JP-B Nos. 48-40347 and 49-24159, and JP-A Nos. 48-80191 and 48-84086.

To prepare the microcapsules containing the coloration component (a), the coloration component (a) encapsulated in the microcapsules may be present in the form of a solution or solid in the capsules.

When the coloration component (a) is encapsulated in the form of a solution in the microcapsules, the coloration component (a) in the form of a solution in a hydrophobic organic solvent may be capsulated. The amount of the organic solvent is preferably 1 to 500 parts by mass based on 100 parts by mass of the coloration component (a).

Generally, the hydrophobic organic solvent includes phosphates, phthalates, acrylates, methacrylates, other carboxylates, fatty acid amides, alkylated biphenyl, alkylated terphenyl, chlorinated paraffin, alkylated naphthalene, diallylethane, compounds which are solid at ordinary temperatures, oligomer oil and polymer oil. Such organic solvents are described specifically in JP-A Nos. 59-178451 to 59-178455, 59-178457, 60-242094, 63-85633, 6-194825, 7-13310, 7-13311, 9-106039 and 63-45084.

In the case when the solubility of the color-forming component (a) to be enencapsulated is low in the above-mentioned organic solvent, a low boiling point solvent in which the solubility is high may be used together. Examples of the low boiling point solvent include ethyl acetate, propyl acetate, isopropyl acetate, butyl acetate and methylene chloride.

As the aqueous phase, on one hand, an aqueous solution having a water-soluble polymer dissolved therein is used, and the oil phase is introduced into it and emulsified and dispersed with a means such as a homogenizer. The water-soluble polymer makes the dispersion easily uniform, and also acts as a dispersing medium for stabilizing the aqueous emulsified dispersion. For uniform emulsification, dispersion and stabilization, a surfactant may be added to the oil phase and/or the aqueous phase. As the surfactant, a known surfactant for emulsification can be used. When a surfactant is added, the amount of the surfactant added is preferably 0.1 to 5%, more preferably 0.5 to 2%, based on the mass of the oil phase.

In the case when the color-forming component A is enencapsulated in a microcapsule, the average particle diameter of the microcapsule is preferably 20 µm or smaller and more preferably 5 µm or smaller in terms of achieving of a high degree of resolution. If the formed microcapsule is too small, the surface area per a given amount of the solid matter is increased and thus a large quantity of a wall agent is required, so that the above-mentioned average particle diameter is preferably 0.1 µm or larger.

The photopolymerizable composition of the invention can be applied not only to the recording material of the invention but also to a wide variety of fields including ink, color filter, hologram, proof, sealant, adhesive, planographic printing, resin letterpress, and photoresist, and other components may be added depending on various applications. When the photopolymerizable composition is used in other materials than the recording material of the invention, 3) polymerizable compound does not necessarily function as the coloration component (b) and the coloration inhibitory compound, and the polymerizable compound having an ethylenically unsaturated bond can be utilized widely.

In the case of a multi-color recording material, the multi-color recording material comprises a plurality of monochromatic recording layers layered on a substrate in which each layer contains a color-forming component (a) (optionally enencapsulated in a microcapsule), which each has a different color formation hue, a color-forming component (b) (optionally having a polymerizable group) having a site for color formation by reaction with each of the color-forming component (a) in a molecule, and a photopolymerizable composition photosensitive to light, each of which is photosensitive to a different wavelength to form a latent image. That is, a spectral sensitizing dye having a different absorption wavelength is used for each photopolymerizable composition to give each photopolymerizable composition photosensitivity to light of a different wavelength. In this case, intermediate layers may be formed between respectively adjacent monochronous recording layers.

The recording layer in a multicolor multilayer recording material can be formed for example in the following manner.

A support is provided thereon with a first recording layer containing microcapsules encapsulating a coloration component (a)Y producing a yellow color, a coloration component (b)Y coloring the coloration component (a)Y, and a photopolymerizable composition to be sensitized with light of central wavelength λ1 to form a latent image; the first recording layer is provided thereon with a second recording layer containing microcapsules encapsulating a coloration component (a)M producing a magenta color, a coloration component (b)M coloring the coloration component (a)M, and a photopolymerizable composition to be sensitized with light of central wavelength λ2 to form a latent image; the second recording layer is provided thereon with a third recording layer containing microcapsules encapsulating a coloration component (a)C producing a cyan color, a coloration component (b)C coloring the coloration component (a)C and a photopolymerizable composition to be sensitized with light of central wavelength λ3 to form a latent image, thus constituting a multilayer recording layer a of laminate structure. If necessary, an intermediate layer is arranged between the layers in the multilayer recording layer α to form a recording layer β, thus constituting the desired multicolor multilayer recording material.

In the case of image formation using the recording material having the above-mentioned multi-color multi-layer recording layer, image exposure is carried out using a plurality of light sources with different wavelength corresponding to the absorption wavelength of each recording layer during the imagewise exposure process to respectively and selectively form latent images in the respective recording layers having the absorption wavelength of the light sources, so that a multi-color image can be formed with a remarkably high sensitivity and high clearness and further by light radiation to the entire surface of the recording layers, the coloration of the non-image area due to the photopolymerizable compositions containing spectral sensitizing dyes or the like remaining in the layers can be decolorized to give a multi-color image with a high image quality and a high contrast.

(Substrate)

For the above-mentioned substrate, any of the paper substrates employed by common pressure sensitive paper, thermal recording paper, and dry or wet type diazo copying paper can be employed. In addition, acidic paper, neutral paper, coated paper, plastic film-laminated paper, synthetic paper and plastic films also may be used.

The recording material of the invention can be suitably used for planographic printing, resin relief printing plate, resists and photo masks for printed board manufacture, sheets for black and white or color transfer coloration, color formation sheet production and the like. For example, in the case when the recording material of the invention is used for the photosensitive and heat-sensitive color formation sheet, the respective components are dissolved or dispersed in appropriate solvents independently or in combination with other types of components to prepare solutions or dispersions and are mixed to obtain coating solutions. Then the coating solutions are applied to a substrate of, for example, paper or a plastic film, and dried to obtain the recording material. For example, in the case when a predetermined component is enencapsulated, a dispersion of the microcapsule enencapsulating the component is prepared and a solution or a dispersion in which another component is dissolved or dispersed is separately prepared and these are mixed to obtain a coating solution. In the preparation of the coating solution, the respective components can be kept in preferable dispersion state using a homogenizer or the like.

Coating and drying can be conducted by methods known in the art.

The recording material of the invention can be subjected to light exposure for forming a latent image, and during or after light exposure, to thermal development treatment to form an image.

For heating in thermal development treatment, a method known in the art can be used. Generally, the heating temperature is preferably 80 to 200° C., more preferably 85 to 130° C. The heating time is preferably 1 second to 5 minutes, more preferably 3 seconds to 1 minute.

After the thermal development, it is preferable to radiate light to the entire surface of the recording material to carry out polymerization in the area where polymerization is not carried out to fix the formed image and to decolorize, decompose, or deactivate the component such as a spectral sensitizing dye, which component remains in the recording layer and lowers the whiteness of the non-image area.

The recording material of the invention can prevent residual color on the surface, etc. by image fixation treatment in a shorter time than for the conventional recording material, to improve whiteness on the surface.

Further, in the case of image formation by the above-mentioned method, the sensitivity can be further improved by setting a step of evenly preheating the entire face of the material during the above-mentioned image formation at a prescribed temperature lower than the coloration temperature. Further, not only the above-mentioned recording method but also any other well-known recording method can be employed.

As described above, the invention provides a recording material with which it is made possible to carry out image recording with a high sensitivity using not only UV rays but also visible light rays to IR rays in a completely dry treatment system, in which no development solution is required to use and accordingly no waste is generated and which has an excellent raw storage property.

Particularly, when the recording material of the invention is formed into a multilayer recording material, the diffusion of the components between the layers can be prevented, and deterioration in unprocessed stock storability can be prevented.

EXAMPLES

Hereinafter, the present invention is described in more detail by reference to the Examples, but the invention is not limited to the Examples. In the Examples, the terms "parts" and "%" refer to "parts by mass" and "% by weight" respectively unless otherwise specified.

First, organic dyes (1) and (2), photoadical generators (1) and (2), amine compounds (1) to (6) and comparative (1) and (2) used in the Examples and Comparative Examples are shown below.

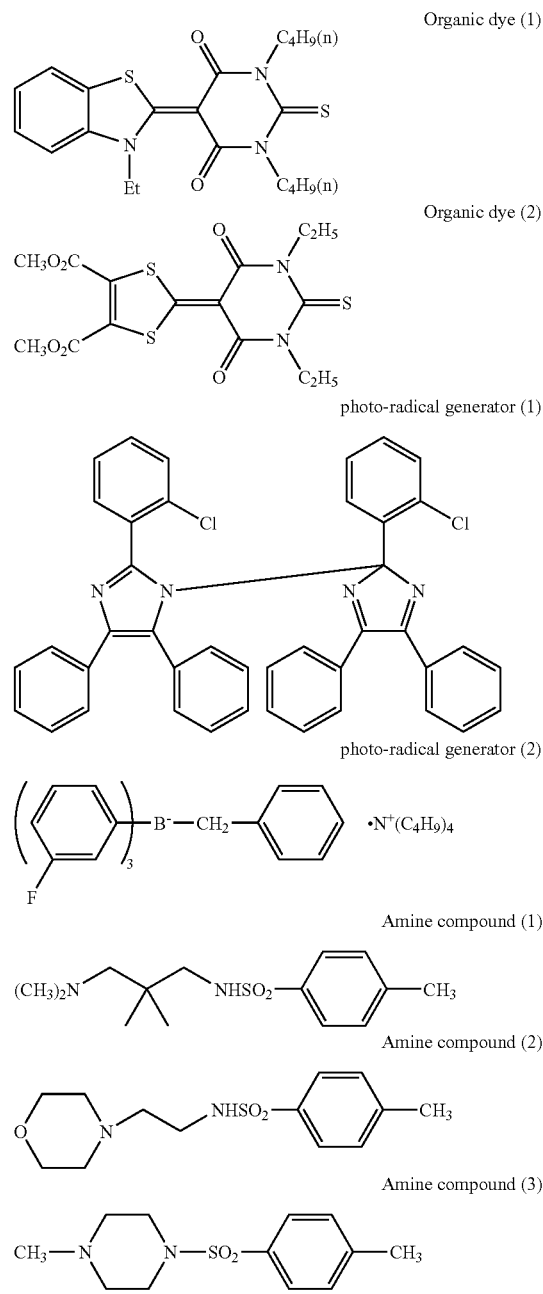

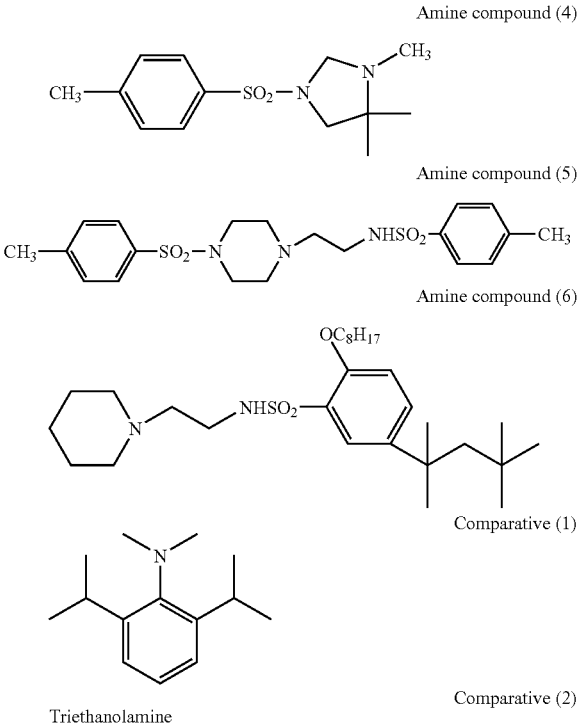

Amine compound (4)

Amine compound (5)

Amine compound (6)

Comparative (1)

Triethanolamine Comparative (2)

Examples 1 to 7

The organic dye, photo-radical generator and amine compound shown in Table 1 are used to prepare a photopolymerizable composition having the following composition. The numbers in the brackets in the organic dye, photo-radical generator and amine compound shown in Table 1 correspond to the compound numbers described above.

| <Photopolymerizable composition> | |
|---|---|
| Pentaerythritol tetraacrylate | 1.41 g |
| Benzyl methacrylate/methacrylic acid | 1.29 g |
| (Copolymer of the monomers in a molar ratio of 73/27) | |
| Methyl ethyl ketone | 12.0 g |
| Propylene glycol monomethyl ether acetate | 8.62 g |
| Organic dye | (see Table 1) |
| Photo-radical generator | (see Table 1) |
| Amine compound | (see Table 1) |
| Methanol | 6.0 g |

Each photopolymerization composition prepared above was applied to a thickness of 2 μm on a dry basis onto a 100 μm polyethylene terephthalate (PET) film and dried at 100° C. for 5 minutes. A protective layer coating solution (1) below was applied onto thereon to a thickness of 1 μm on a dry basis, and dried at 100° C. for 2 minutes, to prepare each of the recording materials in Examples 1 to 7.

| <Protective layer coating solution (1)> | |
|---|---|
| Water | 98.0 g |
| Polyvinyl alcohol | 1.7 g |

| <Protective layer coating solution (1)> | |
|---|---|
| Hydroxypropyl methyl cellulose | 1.7 g |
| Polyvinyl pyrrolidone | 8.7 g |

Comparative Examples 1 to 4

The recording materials in Comparative Examples 1 to 4 were prepared in the same manner as in Examples 1 to 7 except that the type and the amounts of the organic dye, photo-radical generator and amine compound were changed as shown in Table 1.

Each of the thus prepared recording materials in Examples 1 to 7 and Comparative Examples 1 to 4 was exposed to light via a vacuum baking frame device. Exposure of the recording material to light was conducted by irradiating it for 10 seconds with light through a step wedge (density step 0.15; the number of density steps, 1 to 15; "Fuji Step Guide P" (manufactured by Fuji Photo Film Co., Ltd.) and "SC38 Filter" (manufactured by Fuji Photo Film Co., Ltd., a sharp cut filter for cutting off a 380 nm or less light) from a 500 W xenon lamp (manufactured by Ushio Inc.). After exposure to light, a developing solution having the following composition was used to develop each recording material.

| <Composition of the developing solution> | |
|---|---|
| Sodium carbonate anhydride | 10.0 g |
| Butyl Cellosolve | 5.0 g |
| Water | 1.0 L |

On completion of the development, since the exposure dose for the area corresponding to the higher step number of the step wedge was low, the photopolymerizable compositions in the area were eluted to the developing solution to expose the polyethylene terephthalate face. Regarding the recording materials of the respective examples, the areas from which the photopolymerizable compositions were completely eluted were investigated and the step number of the step wedge (the number of clear steps) corresponding to the areas where the exposure dose was highest was measured. The higher the measured number of steps, the higher the sensitivity of the recording materials. The results are shown in Table 1. In cases when the sensitivity was found to be low and the photopolymerizable compositions in all of the exposed areas were eluted to the developing solution, the term, "flow-out", is written in Table and in cases when the sensitivity was found to be high and the photopolymerizable compositions in all of the exposed areas were cured and remained even after the development, the term, "solid", is written in Table.

The recording material was left for 1 day (promotion with time) in an environment of a temperature of 40° C., 90% humidity, then exposed to light and developed in the same manner as above, to determine the number of clear steps, and the results are shown in Table 1. A smaller difference between the number of clear steps after the promotion with time and that just after preparation indicates that the recording material is excellent in unprocessed stock storability.

TABLE 1

|  | organic dye | photo-radical generator | amine compound | the number of clear steps just after preparation | the number of clear steps after the promotion with time |
|---|---|---|---|---|---|
| Example 1 | (1) 0.04 g | (1) 0.20 g | (1) 0.03 g | 6 | 6 |
| Example 2 | (1) 0.04 g | (1) 0.20 g | (2) 0.03 g | 5 | 4 |
| Example 3 | (1) 0.04 g | (1) 0.20 g | (3) 0.03 g | 5 | 4 |
| Example 4 | (1) 0.04 g | (1) 0.20 g | (4) 0.03 g | 6 | 6 |
| Example 5 | (1) 0.04 g | (1) 0.20 g | (5) 0.03 g | 5 | 4 |
| Example 6 | (1) 0.04 g | (1) 0.20 g | (6) 0.03 g | 5 | 5 |
| Example 7 | (2) 0.03 g | (2) 0.12 g | (4) 0.03 g | 5 | 5 |
| Comparative Example 1 | (1) 0.04 g | (1) 0.20 g |  | 2 | flow |
| Comparative Example 2 | (2) 0.03 g | (2) 0.12 g |  | 2 | flow |
| Comparative Example 3 | (1) 0.04 g | (1) 0.20 g | (R1) 0.03 g | 4 | flow |
| Comparative Example 4 | (1) 0.04 g | (1) 0.20 g | (R2) 0.03 g | 4 | flow |

From the results in Table 1, it was revealed that the amine compound-containing recording materials of the invention in Examples 1 to 7, as compared with Comparative Examples 1 to 4, are highly sensitive and excellent in unprocessed stock storability.

Example 8

(Preparation of an Electron-Donating Colorless Dye (1) Capsule Solution)

8.9 g electron-donating colorless dye (1) below was dissolved in 16.9 g ethyl acetate, and 20 g capsule wall agent Takenate D-110N (manufactured by Takeda Chemical Industries, Ltd.) and 2 g Millionate MR200 (manufactured by Nippon Polyurethane Industry Co., Ltd.) were added thereto. The resulting solution was added to a mixture of 42 g of 8% phthalated gelatin and 1.4 g of 10% sodium dodecylbenzene sulfonate, and emulsified and dispersed at 20° C. to give an emulsion. 14 g water and 72 g of 2.9% aqueous tetramethylene pentamine were added thereto and heated to 60° C. under stirring, and after 2 hours, a dispersion of capsules with an average particle diameter of 0.5 μm having the electron-donating colorless dye (1) encapsulated in cores was obtained.

Electron-donating colorless dye (1)

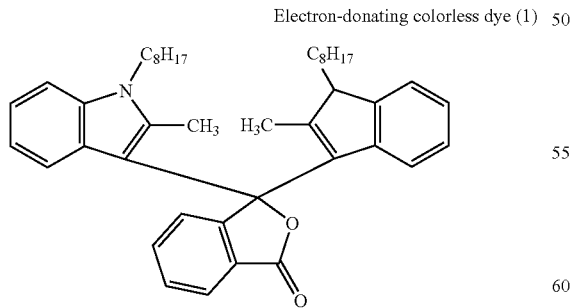

(Preparation of a Photopolymerizable Composition (8) Emulsion)

5.3 g isopropyl acetate was added to the organic dye, photo-radical generator and amine compound shown in Table 2 and 4.2 g polymerizable electro-receiving compound (1) below, and the mixture was stirred to give a solution.

Polymerizable electron-receiving compound (1)

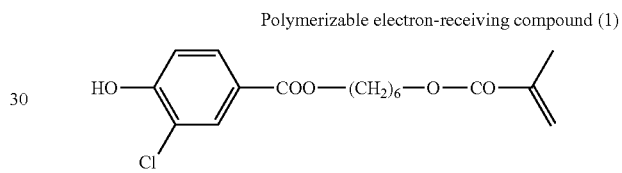

This solution was added to a mixed solution of 13 g of 8% aqueous gelatin solution, 0.8 g of 2% aqueous surfactant (1) below and 0.8 g of 2% aqueous surfactant (2) below, then emulsified and dispersed at 10000 rpm for 5 minutes with a homogenizer (manufactured by Nippon Seiki Co., Ltd.), to give a photopolymerizable composition (8) emulsion.

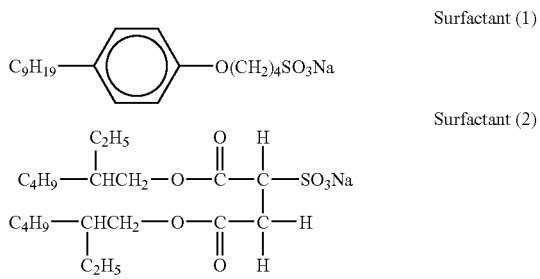

(Preparation of a Recording Layer (8) Coating Solution)

4 g of the electron-donating colorless dye (1), 12 g of the photopolymerizable composition (8) emulsion, and 12 g of 15% aqueous gelatin were mixed to prepare a recording layer (8) coating solution.

(Preparation of a protective Layer Coating Solution (2))

4.5 g of 10% aqueous gelatin solution, 4.5 g distilled water, 0.5 g of 2% aqueous surfactant (3) below, 0.3 g of 2% aqueous surfactant (4) below, 0.5 g of 2% aqueous hardener (1) below, Cyloid 72 (manufactured by FUJIDEVISON CHEMICAL LTD.) in a coating amount of 50 mg/m$^2$, and 1 g Snowtex N were mixed to prepare a protective layer coating solution (2).

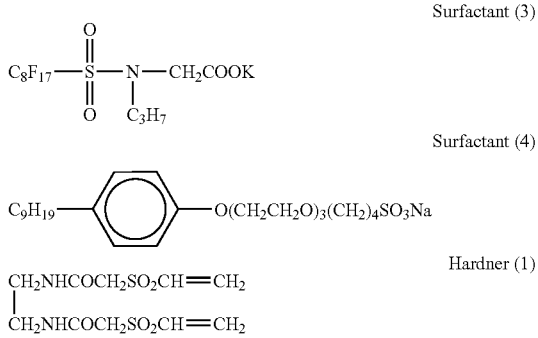

Surfactant (3)

Surfactant (4)

Hardner (1)

(Support)

A white polyester (PET) film of 100 μm in thickness charged with a white pigment ("Lumilar E68L" manufactured by Toray) was used as a support. This support was coated to a thickness of 6 g/m² on a dry-weight basis with the recording layer coating solution (8) by a coating bar and dried at 30° C. for 10 minutes. The protective layer coating solution (2) was applied by a coating bar to a thickness of 2 g/m² on a dry-weight basis thereon and dried at 30° C. for 10 minutes to give the recording material in Example 8.

Examples 9 to 14

The recording materials in Examples 9 to 14 were obtained in the same manner as in Example 8 except that the organic dye, photo-radical generator and amine compound shown in Table 2 were used in place of the organic dye, photo-radical generator and amine compound used in Example 8.

Comparative Examples 5 to 10

The recording materials in Comparative Examples 5 to 10 were obtained in the same manner as in Example 8 except that the organic dye, photo-radical generator and amine compound shown in Table 2 were used in place of the organic dye, photo-radical generator and amine compound used in Example 8.

Each of the recording materials prepared in Examples 8 to 14 and Comparative Examples 5 to 10 was irradiated for 30 seconds with a light from a 500 W xenon lamp through a step wedge and SC38 filter with a vacuum baking frame device, in an environment of a temperature of 24° C., 60% humidity, to form a latent image on each recording material. Thereafter, each recording material was heated on a hot plate at 125° C. for 15 seconds, and as a result, the light-unexposed region had color formed thereon upon reaction of the electron-donating colorless dye (1) with the polymerizable electro-receiving compound (1), while in the light-exposed region, coloration density was reduced or coloration did not occur. The region where coloration did not occur was examined, and the number of wedge steps (number of clear steps) corresponding to a region with the minimum light exposure was determined, and the results are shown in Table 2. A larger number of clear steps indicates higher sensitivity of the recording material.

When sensitivity was high and coloration did not occur in every step, "clear" was given in the table. When sensitivity was low and coloration occurred in every step, "solid" was given in the table.

Stain (surface yellowing) in the first step was measured with a Macbeth reflective densitometer to determine yellow density. Lower yellow density indicates that the recording material is excellent with less stain.

The recording material was humidified in an atmosphere of a temperature of 24° C., 20% humidity for about 1 hour, and then similarly exposed to light and heated under the same conditions to determine the number of clear steps. A smaller difference between the number of clear steps thus determined and the number of clear steps under an environment of a temperature of 24° C., 60% humidity indicates excellent humidity dependence.

The recording material was humidified in an atmosphere of a temperature of 40° C., 90% humidity for 1 day (promotion with time), and then similarly exposed to light and heated in an atmosphere of a temperature of 24° C., 60% humidity, to determine the number of clear steps. A smaller difference between the number of clear steps after the promotion with time and that just after preparation indicates excellent unprocessed stock storability.

TABLE 2

| | organic dye | photo-radical generator | amine compound | the number of clear steps just after preparation 24° C., 60% RH | stain Y density | the number of clear steps just after preparation 24° C., 20% RH | the number of clear steps after the promotion with time 40° C., 90% RH |
|---|---|---|---|---|---|---|---|
| Example 8 | (1) 0.11 g | (1) 0.75 g | (1) 0.17 g | 6 | 0.050 | 6 | 6 |
| Example 9 | (1) 0.11 g | (1) 0.75 g | (2) 0.17 g | 5 | 0.055 | 5 | 5 |
| Example 10 | (1) 0.11 g | (1) 0.75 g | (3) 0.17 g | 5 | 0.056 | 5 | 4 |
| Example 11 | (1) 0.11 g | (1) 0.75 g | (4) 0.17 g | 6 | 0.045 | 6 | 6 |
| Example 12 | (1) 0.11 g | (1) 0.75 g | (5) 0.17 g | 5 | 0.050 | 5 | 5 |
| Example 13 | (1) 0.11 g | (1) 0.75 g | (6) 0.17 g | 5 | 0.045 | 5 | 4 |
| Example 14 | (2) 0.05 g | (2) 0.25 g | (4) 0.17 g | 5 | 0.030 | 5 | 5 |
| Comparative Example 5 | (1) 0.11 g | (1) 0.75 g | | 2 | 0.098 | 1 | solid |
| Comparative Example 6 | (2) 0.05 g | (2) 0.25 g | | 2 | 0.085 | solid | solid |
| Comparative Example 7 | (1) 0.11 g | (1) 0.75 g | (R1) 0.17 g | 4 | 0.124 | 2 | solid |
| Comparative Example 8 | (2) 0.05 g | (2) 0.25 g | (R1) 0.17 g | 4 | 0.105 | solid | solid |
| Comparative Example 9 | (1) 0.11 g | (1) 0.75 g | (R2) 0.17 g | 4 | 0.099 | 2 | solid |

TABLE 2-continued

| | organic dye | photo-radical generator | amine compound | the number of clear steps just after preparation 24° C., 60% RH | stain Y density | the number of clear steps just after preparation 24° C., 20% RH | the number of clear steps after the promotion with time 40° C., 90% RH |
|---|---|---|---|---|---|---|---|
| Comparative Example 10 | (2) 0.05 g | (2) 0.25 g | (R2) 0.17 g | 4 | 0.090 | solid | solid |

From the results in Table 2, it was revealed that the amine compound-containing recording materials of the invention in Examples 8 to 14, as compared with Comparative Examples 5 to 10, are highly sensitive and excellent in unprocessed stock storability, surface yellowing (stain) resistance, and humidity dependence.

What is claimed is:

1. A photopolymerizable composition comprising at least a polymerizable compound having an ethylenically unsaturated bond, a photo-radical generator; and an amine compound represented by the following Formula (I):

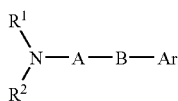

Formula (I)

wherein $R^1$ and $R^2$ independently represent an optionally substituted aliphatic group, and may be bound to each other to form a ring, A represents an optionally substituted divalent aliphatic linking group, and may be bound to $R^1$ or $R^2$ to form a ring, B represents an optionally substituted divalent linking group selected from an amide linkage, a sulfonamide linkage, and an ester linkage, and may be bound to $R^1$ or $R^2$ to form a ring, and Ar represents an optionally substituted aromatic group.

2. The photopolymerizable composition according to claim 1, which further comprises a spectral sensitizing dye.

3. The photopolymerizable composition according to claim 2, wherein the photo-radical generator interacts with the spectral sensitizing dye to generate a radical.

4. The photopolymerizable composition according to claim 1, wherein the photo-radical generator is selected from the group consisting of an organic boron compound, a diaryl iodonium salt, an iron/allene complex, a triazine derivative, an organic peroxide, titanocene, a lophine dimer compound, and diazonium chloride.

5. The photopolymerizable composition according to claim 4, wherein the lophine dimer compound is contained as the photo-radical generator.

6. The photopolymerizable composition according to claim 4, wherein the organic boron compound is contained as the photo-radical generator.

7. The photopolymerizable composition according to claim 1, wherein the content of the photo-radical generator in the photopolymerizable composition is from 0.01 to 20 mass % based on the content of the polymerizable compound having the ethylenically unsaturated bond.

8. The photopolymerizable composition according to claim 1, wherein the polymerizable compound having an ethylenically unsaturated double bond is an ester of an ethylenically unsaturated carboxylic acid and a polyol.

9. The photopolymerizable composition according to claim 1, wherein the content of the polymerizable compound having an ethylenically unsaturated double bond is from 30 to 95 mass % of the entire photopolymerizable composition.

10. A recording material having a recording layer arranged on a support, the recording layer comprising a photopolymerizable composition containing at least a polymerizable compound having an ethylenically unsaturated bond, a photo-radical generator, and an amine compound represented by the following Formula (I):

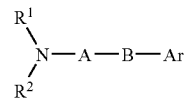

Formula (I)

wherein $R^1$ and $R^2$ independently represent an optionally substituted aliphatic group, and may be bound to each other to form a ring, A represents an optionally substituted divalent aliphatic linking group, and may be bound to $R^1$ or $R^2$ to form a ring, B represents an optionally substituted divalent linking group selected from an amide linkage, a sulfonamide linkage, and an ester linkage, and may be bound to $R^1$ or $R^2$ to form a ring, and Ar represents an optionally substituted aromatic group.

11. The recording material according to claim 10, wherein the recording layer comprises a coloration component (a) and a compound corresponding to a coloration component (b) having a site for reacting with the coloration component (a) to produce color.

12. The recording material according to claim 11, wherein at least one component of the polymerizable compound having an ethylenically unsaturated double bond is the coloration component (b).

13. The recording material according to claim 11, wherein at least one component of the polymerizable compound having an ethylenically unsaturated bond is a coloration inhibitory compound having, in the same molecule, a site for inhibiting the reaction of the coloration component (a) with the coloration component (b).

14. The recording material according to claim 11, wherein the combination, in the recording layer, of the coloration component (a) and the coloration component (b) having a site for reacting with the coloration component (a) to produce color is a combination of an electro-donating dye precursor and an electro-receiving compound.

15. The recording material according to claim 11, wherein the combination, in the recording layer, of the coloration component (a) and the coloration component (b) having a site for reacting with the coloration component (a) to produce color is a combination of a diazo compound and a coupling component.

16. The recording material according to claim 11, wherein the combination, in the recording layer, of the coloration component (a) and the coloration component (b) having a site for reacting with the coloration component (a) to produce color is a combination of a protected dye precursor and a deprotecting agent.

17. The recording material according to claim 11, wherein the combination, in the recording layer, of the coloration component (a) and the coloration component (b) having a site for reacting with the coloration component (a) to produce color is a combination of an oxidant precursor of a p-phenylene diamine derivative or a p-aminophenol derivative.

18. The recording material according to claim 11, wherein the coloration component (a) is encapsulated in microcapsules.

19. A recording material having a recording layer arranged on a support, wherein the recording layer has a multilayer structure comprising a first recording layer to be sensitized with light of a central wavelength $\lambda_1$, a second recording layer to be sensitized with light of a central wavelength $\lambda_2$ to produce a different color than that of the first recording layer, . . . , and an i-th recording layer to be sensitized with light of a central wavelength $\lambda_i$ to produce a different color than those of the first, second, . . . , and i-lth recording layers, each of the layers being laminated in this order and each comprising a photopolymerizable composition containing a polymerizable compound having an ethylenically unsaturated bond, a photo-radical generator, and an amine compound represented by the following Formula (I):

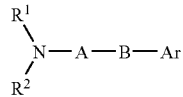

Formula (I)

wherein $R^1$ and $R^2$ independently represent an optionally substituted aliphatic group, and may be bound to each other to form a ring, A represents an optionally substituted divalent aliphatic linking group, and may be bound to $R^1$ or $R^2$ to form a ring, B represents an optionally substituted divalent linking group selected from an amide linkage, a sulfonamide linkage, and an ester linkage, and may be bound to $R^1$ or $R^2$ to form a ring, and Ar represents an optionally substituted aromatic group.

20. The recording material according to claim 19, wherein an intermediate layer is arranged between each of the recording layers.

* * * * *